United States Patent
Fujii

(10) Patent No.: US 8,890,153 B2
(45) Date of Patent: Nov. 18, 2014

(54) ACTIVE MATRIX SUBSTRATE AND DISPLAY DEVICE

(75) Inventor: Akiyoshi Fujii, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 92 days.

(21) Appl. No.: 13/513,993

(22) PCT Filed: Nov. 30, 2010

(86) PCT No.: PCT/JP2010/071369
§ 371 (c)(1),
(2), (4) Date: Jun. 5, 2012

(87) PCT Pub. No.: WO2011/070944
PCT Pub. Date: Jun. 16, 2011

(65) Prior Publication Data
US 2012/0241748 A1    Sep. 27, 2012

(30) Foreign Application Priority Data
Dec. 8, 2009 (JP) ................................. 2009-278781

(51) Int. Cl.
G02F 1/1362 (2006.01)
H01L 27/12 (2006.01)
G02F 1/1335 (2006.01)

(52) U.S. Cl.
CPC ....... *G02F 1/136286* (2013.01); *H01L 27/1214* (2013.01); *G02F 1/133502* (2013.01); *G02F 2001/13629* (2013.01)
USPC .................................. 257/59; 257/E29.273

(58) Field of Classification Search
CPC ................ H01L 27/1214; H01L 27/12; H01L 29/78633; H01L 27/1225; H01L 27/1288
USPC .......................................................... 257/59
See application file for complete search history.

(56) References Cited

U.S. PATENT DOCUMENTS

| 5,953,088 | A | 9/1999 | Hanazawa et al. |
| 6,788,355 | B1 | 9/2004 | Ihida et al. |
| 2002/0003588 | A1 | 1/2002 | Okada et al. |
| 2004/0017521 | A1 | 1/2004 | Okada et al. |
| 2009/0033608 | A1* | 2/2009 | Kim ................................. 345/92 |
| 2010/0277447 | A1* | 11/2010 | Itoh et al. ...................... 345/205 |
| 2013/0293449 | A1* | 11/2013 | Han et al. ........................ 345/32 |

FOREIGN PATENT DOCUMENTS

| JP | 61-137924 U | 8/1986 |
| JP | 11-242244 A | 9/1999 |
| JP | 2001-125134 A | 5/2001 |
| JP | 2001-281682 A | 10/2001 |
| JP | 2005-164789 A | 6/2005 |
| JP | 2006-276370 A | 10/2006 |
| JP | 2007-086112 A | 4/2007 |

OTHER PUBLICATIONS

International Search Report.

* cited by examiner

*Primary Examiner* — Tony Tran
(74) *Attorney, Agent, or Firm* — Harness, Dickey & Pierce, P.L.C.

(57) ABSTRACT

An active matrix substrate is disclosed, enabling to suppress variation in signal voltages among pixel electrodes. An active matrix substrate includes: an insulating substrate; a plurality of pixel electrodes arranged in a matrix on the insulating substrate; and a source wiring extending in a column direction so as to overlap with two pixel electrodes adjacent to each other in a row direction on the insulating substrate. The pixel electrodes and the source wiring are formed in different layers via an insulating film, the source wiring has a main line portion and extension portions extended from both sides of the main line portion, and the extension portion is formed of a transparent conductive material.

11 Claims, 28 Drawing Sheets

Fig. 15
| |
|---|
| Polarizer (n=1.5) |
| Glass substrate (n=1.5) |
| CF resin (n=1.5) |
| ITO (n=1.9) |
| Liquid crystal (n=1.5) |
| ITO (n=1.9) |
| Acrylic resin (n=1.5) |
| ITO (n=1.9) | Al |
| Passivation film SiNx(n=2.0) |
| Gate insulating film SiNx(n=2.0) |
| Glass substrate (n=1.5) |
| Polarizer (n=1.5) |
Fig. 16
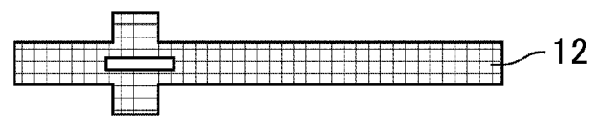
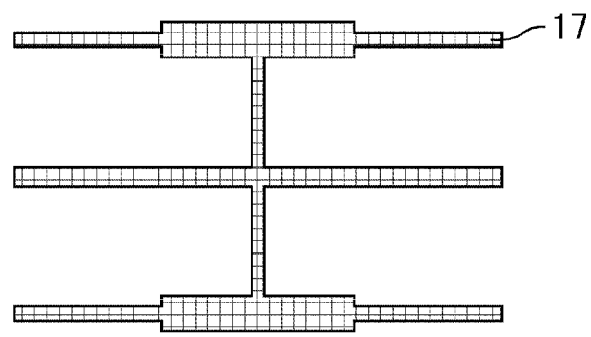
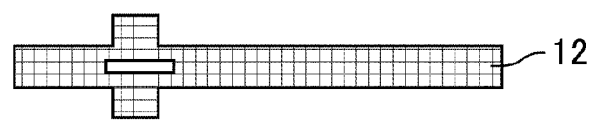

Refractive index

ACTIVE MATRIX SUBSTRATE AND DISPLAY DEVICE

TECHNICAL FIELD

The present invention relates to an active matrix substrate and a display device. More specifically, the present invention relates to an active matrix substrate suitably used as a substrate of a display device in which polarity inversion driving is conducted. The present invention also relates to a display device comprising the active matrix substrate.

BACKGROUND ART

Display devices recently used in TVs, PCs, and mobile phones are commonly produced using a substrate such as a glass substrate as a base. On the substrate, a circuit element, a control element, and the like are mounted to form a display device.

Various skills are exercised in production of these display devices for achieving high resolution display. For example, in a display region, a plurality of gate wirings and a plurality of source wirings are respectively arranged in the row direction and in the column direction, and each pixel has a translucent pixel electrode and a switching element for controlling electrical conduction between the pixel electrode and each wiring so that each pixel is individually controlled.

For a specific example, in a liquid crystal display device having a pair of substrates sandwiching a liquid crystal layer, one of the substrates is a substrate having the above-mentioned wirings and the like so that the tilt of liquid crystal molecules in the liquid crystal layer may be controlled in each pixel, thereby realizing high-resolution liquid crystal display (see Patent Literature 1). Here, a substrate in which an active element such as a thin film transistor (TFT) is used as a switching element and pixel electrodes are arranged in a matrix is also referred to as an active matrix substrate.

Favorable materials forming the pixel electrodes include metal oxides such as ITO (Indium Tin Oxide) having translucency. Favorable materials forming the gate wiring, the source wiring, and electrodes in the TFT include metals having a low specific resistance such as aluminum (Al), and copper (Cu), and further include metals such as chromium (Cr), titanium (Ti), and molybdenum (Mo). The pixel electrodes and each wiring may be formed by stacking these materials on a substrate by sputtering and then patterning the materials into desired shapes by photolithography (see Patent Literature 2).

CITATION LIST

Patent Literature 1

Japanese Kokai Publication No. 61-137924 (JP-U 61-137924)

Patent Literature 2

Japanese Kokai Publication No. 2001-125134 (JP-A 2001-125134)

SUMMARY OF INVENTION

Technical Problems

The present inventors have studied the structure of active matrix substrates commonly used in display devices to find out the following problem. Namely, in the active matrix substrate comprising the various wirings and the pixel electrodes as mentioned above, arrangement of the source wirings and the pixel electrodes in different layers via an insulating film forms a certain amount of static capacitance (hereinafter, also referred to as coupling capacitance) between the pixel electrodes and the source wirings. This coupling capacitance may cause degradation in display quality.

FIGS. 43 and 44 are schematic plane views each illustrating an area where a coupling capacitance is formed between the pixel electrodes and the source wirings. FIG. 43 illustrates a case where no dislocation is present between the source wirings and the pixel electrodes. FIG. 44 illustrates a case where a dislocation is present between the source wiring and the pixel electrodes. As illustrated in FIG. 43, in a case where pixel electrodes 311 are formed in a matrix, source wirings 313 are commonly positioned between the pixel electrodes 311. Additionally, if the source wirings 313 and the pixel electrodes 311 are arranged in different layers via an insulating film, the area of the pixel electrodes 311 can be increased to improve the aperture ratio, compared to the case where they are arranged in the same layer. Accordingly, an insulating film is commonly provided between the source wirings 313 and the pixel electrodes 311. In such a case, the source wirings 313 and the pixel electrodes 311 are partially overlapped. In the overlapping region, the coupling capacitance is formed. The value of the coupling capacitance is proportional to the area of the overlapping region.

However, in the case where the layer in which the source wirings 313 are formed and the layer in which the pixel electrodes 311 are formed are different, a dislocation between the source wirings 313 and the pixel electrodes 311 are caused in reality. Then, as illustrated in FIG. 44, the center line of the source wiring 313 and the center line of the space between the adjacent pixel electrodes 311 do not coincide with each other.

Such a dislocation may cause the following problem, for example, in a case where the drive system is employed in which the polarities in the adjacent pixel electrodes 311 are different from each other. A signal voltage for the pixel electrodes 311 are applied via the source wirings 313. Therefore, if the voltages applied to the pixel electrodes 311 in adjacent pixels have different poralities, the source wirings 313 adjacent to each other supply signal voltages having different polarity. Then, each pixel electrode 311 (+) or pixel electrode 311 (−) overlaps with two source wirings 313 (+) and (−) which have different polarities to form coupling capacitances respectively with the source wirings 313 (+) and (−). Then, if the overlapping area of the pixel electrode 311 (+) or (−) with the source wiring 313 (+) and with the source wiring 313 (−) are different due to a dislocation, the value of the coupling capacitance formed therebetween varies for each pixel electrode 311. This makes the amount of the signal voltage in the pixel electrodes 311 be different among the pixel electrodes 311, causing variation in brightness for each pixel. As a result, the display quality is degraded.

The present invention devised in consideration of the above state of the art provides an active matrix substrate enabling to suppress variation in signal voltages among pixel electrodes. The present invention also provides a display device suppressing degradation in display quality which is caused by the variation in signal voltages among pixel electrodes and reducing an internal reflection without lowering the aperture ratio.

Solution to Problem

The present inventors noted that variation in signal voltages of pixel electrodes can be suppressed by increasing the overlapping area between a source wiring and a pixel electrode. This increase is aimed to adjust the overlapping area of a pixel electrode with a source wiring so as not to be significantly different from the overlapping area of the pixel electrode with the adjacent pixel electrode.

The present inventors also noted the following fact. Namely, in the case where the area of the source wiring is increased to overlap with the pixel electrode, the light shielding properties of the source wiring lowers the aperture ratio of the pixel. In such a case, in a display device, external light is reflected on the surface of the source wiring to cause, for example, reflections of fluorescent lamps on the display screen by reflections from inside. As a result, the display quality may be lowered. According to the study by the present inventors, such an influence by internal reflections is particularly significant when the display screen of the display device undergoes the anti-reflection treatment such as application of a low-reflectance film.

To solve the above problem, it may be considered to form the whole source wiring using a translucent metal oxide such as ITO. In such a case, however, too-high specific resistance of ITO does not allow application of sufficient signal voltages to all the pixel electrodes.

The present inventors made intensive studies to find out the following fact. Namely, extension portions of the source wiring suppress difference in the coupling capacitances formed between adjacent pixels without lowering the aperture ratio, wherein the extension portions are formed by extending the both sides of the source wiring to a certain width and formed of a translucent conductive material. Accordingly, the present inventors solved the above problems and completed the present invention.

Namely, the present invention provides an active matrix substrate comprising: an insulating substrate; a plurality of pixel electrodes arranged in a matrix on the insulating substrate; and a source wiring extending in the column direction so as to overlap with two pixel electrodes adjacent to each other in the row direction on the insulating substrate, wherein the pixel electrodes and the source wiring are formed in different layers via an insulating film, the source wiring has a main line portion and extension portions extended from both sides of the main line portion, and the extension portion is formed of a transparent conductive material.

The active matrix substrate of the present invention comprises a plurality of pixel electrodes arranged in a matrix and a source wiring extending in the column direction so as to overlap with two pixel electrodes adjacent to each other in the row direction, on the insulating substrate. The source wirings supply a signal voltage to the pixel electrodes. The pixel electrodes are each charged in accordance with the amount of the signal voltage supplied from the source wirings.

The pixel electrodes and the source wiring are formed in different layers via an insulating film. This configuration allows to increase the area of one pixel electrode, compared to the case where the pixel electrodes and the source wiring are arranged in the same layer. As a result, the aperture ratio is improved. If the area of one pixel electrode is increased so as to overlap with a part of the source wiring, a certain amount of a coupling capacitance is formed between the source wiring and the pixel electrode. In the present invention, an area overlapping with one pixel electrode corresponds to one pixel.

The source wiring has a main line portion and extension portions extended from both sides of the main line portion. The extension portions are formed of a transparent conductive material. The main line portion of the source wiring is a portion for supplying signal voltages to the pixel electrode from a supply source, such as a source driver, in the whole source wiring. The extension portions of the source wiring mainly adjust the value of the coupling capacitance between the adjacent pixel electrodes. This function suppresses variation in the signal voltages of the pixel electrodes. Since the extension portions are formed of a transparent conductive material, the source wiring is prevented from shielding light so that the light reflected on the surface of the source wiring is reduced.

The configuration of the active matrix substrate of the present invention is not especially limited as long as it essentially includes such components. The active matrix substrate may or may not include other components. Preferable embodiments of the active matrix substrate of the present invention are mentioned in more detail below.

Potentials of the two pixel electrodes adjacent to each other in the row direction are preferably different in polarity. This prevents flicker and image persistence in display when the active matrix substrate of the present invention is used in a display device. Also, variation in the coupling capacitance among the pixel electrodes is suppressed. As a result, variation in brightness is suppressed.

The main line portion is preferably a laminate including a layer formed of the transparent conductive material and a layer formed of a conductive material having a specific resistance lower than a specific resistance of the transparent conductive material. If the whole main line portion of the source wiring is formed of a transparent conductive material used in the extension portions of the source wiring, the resistance of the whole source wiring is too large, leading to a case where the conduction velocity of the signal voltage is lowered. Accordingly, stacking of electrodes having a lower specific resistance compared to that of the transparent conductive material used in the extension portions efficiently suppresses an increase in the resistance of the whole source wiring. More preferably, the layer formed of the transparent conductive material is formed on the side closer to the insulating substrate from the layer formed of a conductive material having a lower specific resistance than the transparent conductive material. This realizes more efficient production process by photolithography.

The conductive material having a lower specific resistance than the transparent conductive material is preferably aluminum or copper. In the case of using aluminum, a layer formed of chromium, titanium, tantalum, or molybdenum is preferably sandwiched between the layer formed of aluminum and the layer formed of the transparent conductive material. This configuration prevents corrosion caused by contact potential difference. Moreover, since titanium and tantalum each have a lower reflectance in comparison with aluminum and copper, it is preferable to further form a layer formed of titanium or tantalum on the upper side (opposite side of the insulating substrate side) of the layer formed of aluminum or copper.

The source wiring and the pixel electrodes are preferably connected to each other via a thin film transistor and a drain wiring drawn from the thin film transistor. The drain wiring is preferably formed of the transparent conductive material. The thin film transistor provided between the source wiring and the pixel electrodes controls on/off of the signal voltage to the pixel electrodes. Here, the thin film transistor may be connected with the pixel electrodes via the drain wiring. When the drain wiring is also formed of the transparent conductive material that is used to form the extension portions of the source wiring, the portion shaded by the drain wiring decreases and the reflection is reduced on the surface of the drain wiring.

The present invention also provides a display device comprising the active matrix substrate. According to the active matrix substrate of the present invention, degradation in the display quality caused by variation of the signal voltages among the pixel electrodes and the internal reflection is reduced without lowering the aperture ratio.

The display device preferably has an antireflection film on the top surface of members constituting a display face. Further, the display device preferably has a front board and an antireflection film attached to one or both faces of the front board. Moreover, the surface with the antireflection film preferably has a reflectance of not more than 0.5% in the visible light range. The active matrix substrate of the present invention can suppress the internal reflection of the display device when used in the display device. Accordingly, the active matrix substrate is favorably used in a display device in which an antireflection film capable of preventing surface reflection is attached to the top surface of the members constituting the display face of the display device, and, in the case where a front board is provided, in a display device in which an antireflection film is attached to one or both faces of the front board.

Examples of the front board include a protection board for protecting the display panel, which is provided in front of a panel of a gaming machine, mobile phone, or laptop computer.

Preferable examples of the antireflection film include (1) a LR (Low Reflection) film or AR (Anti Reflection) film reducing reflection light by light interference and (2) a moth eye film having a plurality of protrusions positioned at a width of not more than the visible light wavelength between the adjacent top portions thereof on the surface. According to (2) the moth eye film, the reflectance of the top surface of the members constituting the display screen is almost surely lowered to not more than 0.5%.

The present inventors actually made a moth eye film among the above mentioned antireflection films, and set the film on the panel surface constituting the display device. They tested its effect to find out that, when the light reflected on the surface of the panel or front board (surface reflection) is suppressed, the improvement in the visibility is disturbed by the reflection caused by the internal configuration of the panel (internal reflection) which has not attracted attentions.

The internal reflection of the panel occurs as follows. Namely, materials used in the internal structure of the panel are stacked in layers to form interfaces between respective layers. The layers interposing the interface have a refractive index difference to cause the internal reflection. In particular, a reflection of a wiring that controls display driving, namely, a metal wiring, affects a lot. Examples of such a metal wiring include wirings used for the source wiring, the drain wiring, and a storage capacitor wiring (CS wiring). The metal wiring is also usable as a black matrix to block the light from the inside such as backlight. However, such metal wirings are directly visible from the side of the panel surface (from the outside), and therefore, the light reflected on the surfaces of these metal wirings are directly exited to the outside, directly affecting the display. In addition, since metal wirings are often made of aluminum (Al), the reflectance is large to contribute to the internal reflection.

On the other hand, in the display device of the present invention, a metal wiring directly visible from the outside is made of a transparent material, so that the reflection of light on the surface of the metal wiring is suppressed and the pixel transmittance is increased. The transparent electrode reduces the reflection compared to the reflection on the surface of the metal wiring, while the refractive index surface is still present. Consequently, the reflected light is, on the whole, reduced.

If the reflection of external light by the members inside the display device (internal reflection) increases, the light originally used as the display light (e.g. light exited from the backlight source in the liquid crystal display device) is significantly disturbed when the display light and the light generated by reflection of the external light are mixed. For example, if the display device is positioned near objects which may serve as light sources or secondary light sources (e.g. white wall) in a bright room, these objects may be reflected on the display screen of the display device. In such a case, images on the display screen of the display device are hardly seen. Especially in the case that the display device shows a black display, the reflected objects are more clearly visible so that the black display is hardly recognized. Then, the contrast ratio in the display screen is extremely lowered. Accordingly, prevention of such reflection is needed to increase the contrast ratio in the bright surroundings.

As above described, in the case where treatment for suppressing the surface reflection such as application of an antireflection film is conducted, the effect of the internal reflection is especially significant. Therefore, especially effective is suppression of the influence of the internal reflection when the surface reflection of the display device is suppressed. Accordingly, high-quality display is realized in which lowering of the contrast ratio is suppressed.

Advantageous Effects of Invention

According to the active matrix substrate of the present invention, variation in the signal voltages among the pixel electrodes can be suppressed. According to the display device of the present invention, variation in the signal voltages among the pixel electrodes can be suppressed and also the internal reflection is suppressed without lowering the aperture ratio, so that high-quality display is realized.

BRIEF DESCRIPTION OF DRAWINGS

FIG. 15 is a schematic cross-sectional view illustrating layers of the display device of Embodiment 1.

FIG. 16 is a schematic plan view illustrating a production flow of an active matrix substrate in Embodiment 1 and shows a stage in which a gate wiring and a CS wiring are formed.

DESCRIPTION OF EMBODIMENTS

The present invention is described in more detail based on, but not limited to, embodiments with reference to drawings.

Embodiment 1

Embodiment 1 is an example of a display device of the present invention in which an active matrix substrate of the present invention is used. The display device of Embodiment 1 comprises a liquid crystal display panel having: a pair of substrates including an active matrix substrate with a pixel electrode, a TFT, and the like and a color filter substrate with a color filter, a black matrix, and the like; and a liquid crystal layer sandwiched between the substrates.

The active matrix substrate in Embodiment 1 has a glass substrate (insulating substrate) as a base. On the glass substrate, a plurality of pixel electrodes 11 are aligned in a matrix. Driving of liquid crystals is controlled in each pixel electrode 11.

Figure 1:
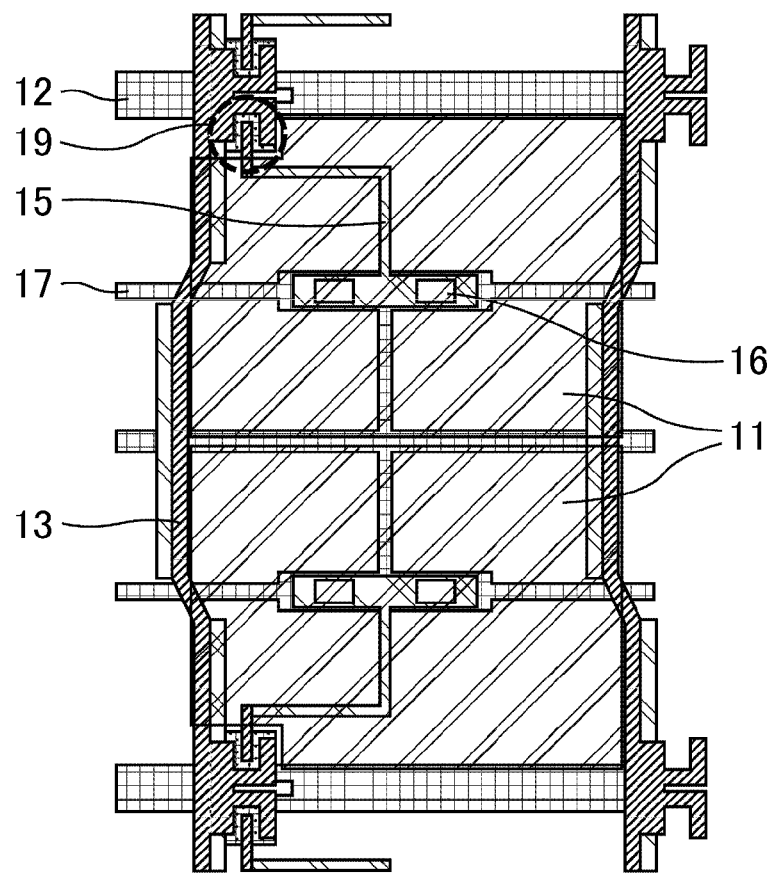
FIG. 1 is a plan view schematically illustrating a pixel configuration of an active matrix substrate in Embodiment 1.

FIG. 1 is a plan view schematically illustrating a pixel configuration of an active matrix substrate in Embodiment 1. The active matrix substrate in Embodiment 1 includes layers in which a gate wiring 12, a source wiring 13, a drain wiring 15, a storage capacitor wiring (CS wiring) 17 and the like are provided respectively via insulating films, in addition to a layer in which the pixel electrode 11 is provided. Here, it is not necessary to individually arrange these wirings in different layers. For example, the gate wiring 12 and the CS wiring 17 may be formed of the same material in the same layer. Alternatively, the source wiring 13 and the drain wiring 15 may be formed of the same material in the same layer. Such a configuration improves the production efficiency.

As illustrated in FIG. 1, the gate wiring 12 is arranged along the column direction of the pixel electrode 11 and overlaps with a space between two pixel electrodes 11 adjacent to each other in the column direction. The source wiring 13 is arranged along the row direction and across the gate wiring 12 via an insulating film. In the vicinity of the intersection of the gate wiring 12 and the source wiring 13, a TFT 19 functioning as a switching element for controlling pixels is positioned. The TFT 19 controls when to apply a signal voltage from the source wiring 13 to the pixel electrode 11 in accordance with the timing of a gate voltage sent from the gate wiring 12. In Embodiment 1, two pixel electrodes 11 are arranged in each area surrounded by the gate wirings and the source wirings, and a multi-pixel driving method is employed in which one gate wiring 12 controls both the pixel electrodes 11 positioned on both sides of the gate wiring 12.

The TFT 19 is a three-terminal field effect transistor and has three electrodes including a gate electrode, a source electrode, and a drain electrode. The gate electrode is connected to the gate wiring 12. The source electrode is connected to the source wiring 13. From the drain electrode of the TFT 19, the drain wiring 15 is drawn towards the center of a sub pixel. A contact hole 16 is formed in the insulating film that is overlapping with the drain wiring 15 positioned at the center of the pixel. Via the contact hole 16, the drain wiring 15 and the pixel electrode 11 are electrically connected to each other.

In Embodiment 1, the CS wiring 17 is arranged between the gate wirings 12 in the row direction. The CS wiring 17 is positioned to overlap with the drain wiring 15 via an insulating film at the center part of the pixel so as to form a certain amount of storage capacitance with the drain wiring 15. Various wirings such as the gate wiring 12 and the CS wiring 17 may each have a configuration of a laminate comprising a layer formed of tantalum nitride (TaN), titanium nitride (TiN), molybudenum (Mo), or the like stacked on and under a layer formed of aluminum (Al), copper (Cu), or the like. In the main line portion of the source wiring 13, a similar conductive material is used. However, in the coupling portions of the source wiring 13 and the drain wiring 15, a transparent conductive material is used instead of such a light-shielding conductive material.

In Embodiment 1, the source wiring 13 has a bent portion. A crossing part is formed from that bent portion in such a manner as to cross a space between two pixel electrodes 11 adjacent to each other in the row direction. Accordingly, the main line portion of the source wiring 13 has a zigzag shape as a whole. This shape allows a single source wiring 13 to overlap with two pixel electrodes 11 adjacent to each other. In comparison with the case where the source wiring 13 has a linear shape, the overlapping area of the source wiring 13 and the pixel electrode 11 is larger. Accordingly, even when misalignment occurs, it is possible to suppress variation in the coupling capacitance formed between the pixel electrode 11 and the source wiring 13 among the pixel electrodes 11. Moreover, in Embodiment 1, the coupling portion is formed of transparent ITO, and therefore, the internal reflection caused by the source wiring arranged at a directly-visible position can be reduced.

Figure 2:
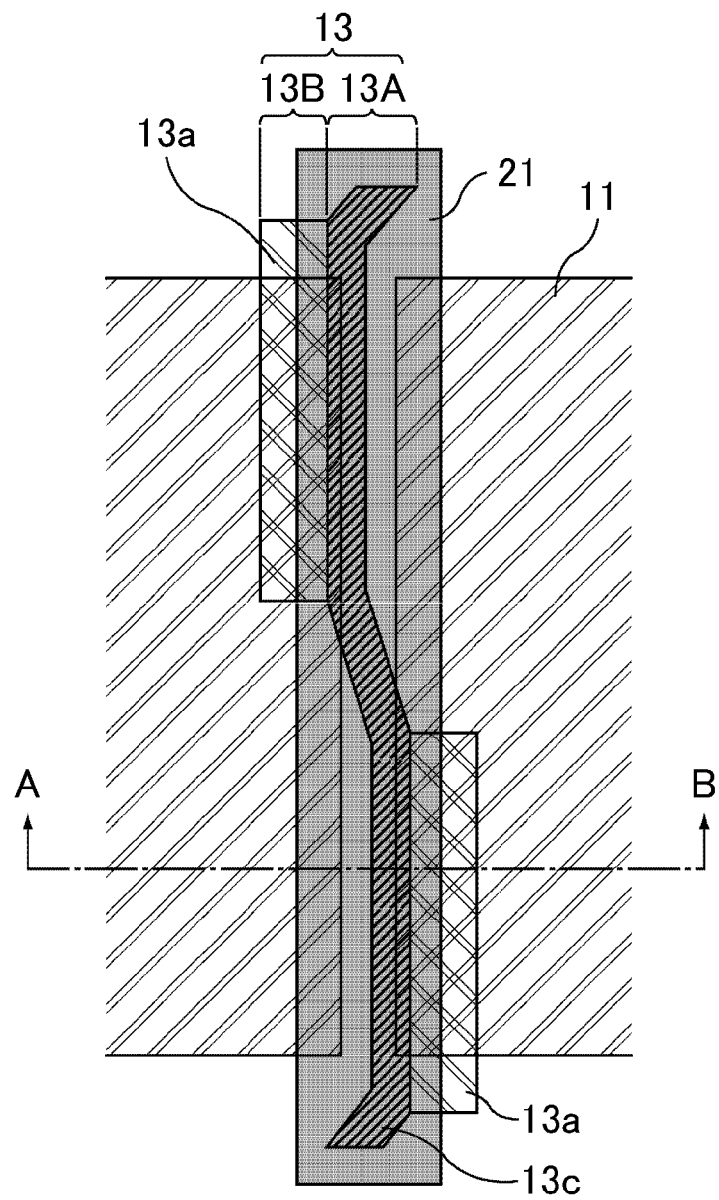
FIG. 2 is an enlarged view schematically illustrating a source wiring of the active matrix substrate in Embodiment 1.

FIG. 2 is an enlarged view schematically illustrating a source wiring of the active matrix substrate in Embodiment 1. The source wiring 13 has a main line portion 13A running in the column direction and coupling portions (extension portions) 13B respectively extending to a predetermined area from both sides of the main line portion 13A. The coupling portions 13B are respectively provided on the right and left of the main line portion 13A of the source wiring that crosses a space between the pixel electrodes 11 adjacent to each other in the row direction. The area of the coupling portion 13B on the left and the area of the coupling portion 13B on the right are substantially the same. The coupling portions 13B each have a length substantially half the length of the pixel electrode 11. The shapes of the coupling portions 13B are each a rectangular shape. Though FIG. 2 illustrates a rectangular coupling portion, the shape is not particularly limited and may be changed as long as the effect of the present invention is enough achieved.

A gray part in FIG. 2 indicates an area where a black matrix 21 is formed. In Embodiment 1, the black matrix 21 is formed in the color filter substrate (counter substrate) in such a manner as to overlap with a space between the pixel electrodes 11. This configuration suppresses light leakage caused by misalignment (disinclination) of liquid crystal molecules positioned in the vicinity of the space between the pixel electrodes 11. As a result, a better contrast is achieved. The black matrix 21 may be formed of an insulating material or a conductive material as long as it shields light.

Exemplary materials of the coupling portions (extension portions) 13B of the source wiring 13 include metal oxides such as ITO, IZO (Indium Zinc Oxide), and AZO (Aluminum Zinc Oxide) which have translucency. From the standpoint of processability, ITO is more preferable. Since these materials have translucency, reflection of external light can be suppressed which may be caused when a common metallic component is used. In the case where the coupling portions 13B of the source wiring 13 are formed of a metallic material mainly comprising aluminum, the external light is reflected on the surface of the source wiring 13 to cause, for example, reflection of fluorescent lamps on the display screen, resulting in the lowered display quality. To counter this, covering of the source wiring 13 with the black matrix 21 for preventing reflection may be considered. However, this arrangement problematically lowers the aperture ratio. On the other hand, in the case where the whole source wiring 13 is formed of a translucent metal oxide such as ITO, the resistance increases so that the signal voltage may not be sufficiently applied to all the pixel electrodes, resulting in display failure.

In Embodiment 1, in addition to the translucent metal oxide, a metal having a low specific resistance such as aluminum (Al) and copper (Cu) or a metallic material such as chromium (Cr), titanium (Ti) and molybdenum (Mo) is used to form the main line portion 13A and only the above metal oxide is used to form the coupling portions 13B, as described above. This allows uniform application of the signal voltage to all the pixel electrodes 11 as well as improvement in the aperture ratio and suppression of the internal reflection.

Figure 3:
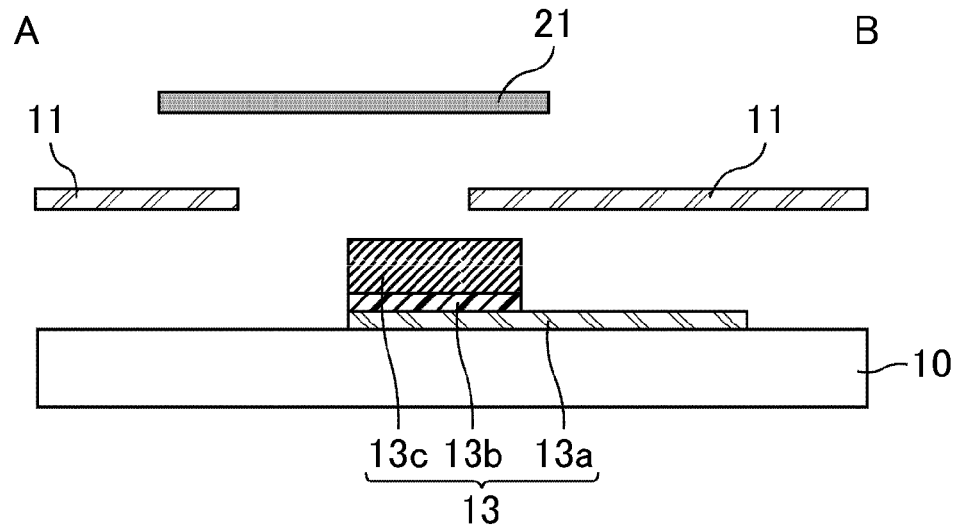
FIG. 3 is a schematic cross-sectional view taken along an A-B line in FIG. 2.

FIG. 3 is a schematic cross-sectional view taken along an A-B line in FIG. 2. As illustrated in FIG. 3, the active matrix substrate in Embodiment 1 has the source wiring 13 and the pixel electrode 11 on the glass substrate (insulating substrate) 10. In the counter substrate, the black matrix 21 is arranged at a position covering an edge portion of each pixel electrode 11.

In the source wiring 13 in Embodiment 1, the main line portion has a configuration in which an ITO layer 13a, a titanium (Ti) layer 13b, and an aluminum (Al) layer 13c are sequentially stacked in this order on the glass substrate 10. The coupling portion is formed only of the ITO layer 13a. The Ti layer 13b is preferable as a layer sandwiched between the Al layer 13c and the ITO layer 13a for avoiding a direct contact thereof and also has a function of adhering these layers. If the ITO layer 13a and the Al layer 13c directly contact to each other, a contact electromotive force easily corrodes the Al layer. Accordingly, the Ti layer 13b is preferably arranged as an intermediate layer.

The configuration of Embodiment 1 is particularly advantageous in the case where the adjacent pixel electrodes 11 have different polarities. In the case where two pixel electrodes 11 adjacent to each other have different polarities and the overlapping area of the pixel electrode 11 and the source wiring 13 varies among the pixel electrodes 11, the size of the coupling capacitance formed with the source wiring 13 varies among the pixel electrodes 11. This causes variation in the voltage retained in the pixel electrodes 11. However, the coupling portion mentioned above allows easy equalization of the overlapping area of each pixel electrode 11 and the source wiring 13 among the pixel electrodes 11. Accordingly, variation in brightness is suppressed by reduction in the variation in the voltage among the pixel electrodes 11, maintaining the display quality of each pixel.

Figure 4:
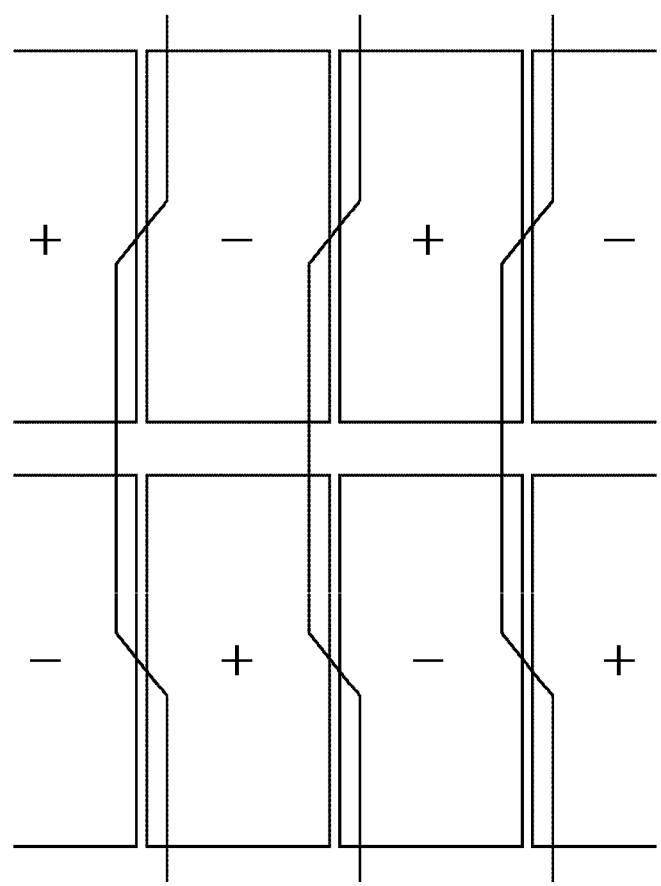
FIG. 4 is a plan view schematically illustrating polarities of the pixel electrodes in the display device of Embodiment 1.

FIG. 4 is a plan view schematically illustrating polarities of the pixel electrodes in the display device of Embodiment 1. In Embodiment 1, the driving method of the pixel electrode is a dot inversion driving method. In the dot inversion driving, each of the pixel electrodes arranged in the row direction or in the column direction receives a signal having a polarity opposite to the polarity thereof. Accordingly, the pixel electrodes in Embodiment 1 are arranged in such a manner that the polarity is alternate (order of +, −, +, −) in both direction of the row direction and the column direction. Such polarities may be inverted by the gate driver connected to the gate wiring and by the source driver connected to the source wiring. The dot inversion driving method efficiently suppresses a flicker.

According to the configuration of Embodiment 1, the display quality can be maintained even when the adjacent pixel electrodes 11 have different polarities. Accordingly, the flicker is prevented, variation in brightness caused by brightness difference between the adjacent pixel electrodes 11 is prevented, and light leakage occurring in the space between the pixel electrodes 11 is prevented so that the better contrast is achieved. As a result, high-quality display is achieved.

Hereinafter, a production method of the main line portion and the coupling portions of the source wiring is described with reference to cross-sectional views. FIGS. 5 to 13 are schematic cross-sectional views illustrating a production flow of the main line portion and the coupling portions of the source wiring in Embodiment 1 and each drawing shows a production stage. Here, description of the gate wiring and a semiconductor forming portion of the TFT substrate is omitted and the description is started from formation of the source wiring.

Figure 5:
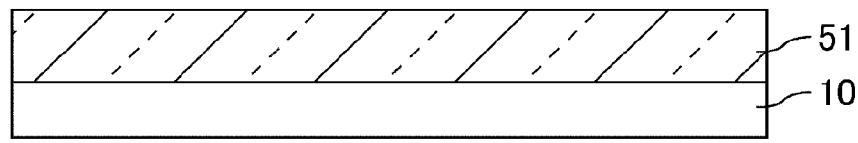
FIG. 5 is a schematic cross-sectional view illustrating a production flow of a main line portion and a coupling portion of a source wiring in Embodiment 1 and shows a stage in which a gate insulating film is formed.
Figure 6:
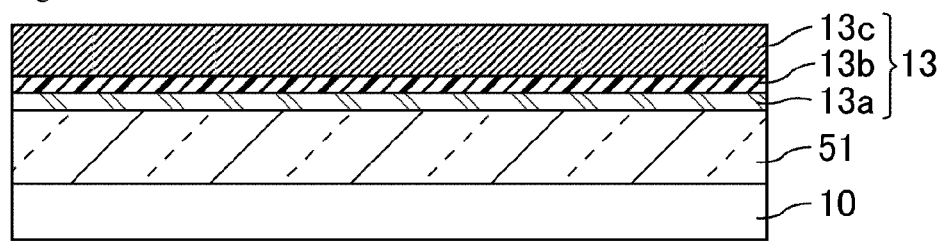
FIG. 6 is a schematic cross-sectional view illustrating a production flow of the main line portion and the coupling portion of the source wiring in Embodiment 1 and shows a stage in which an ITO layer, a Ti layer, and an Al layer are formed.
Figure 7:
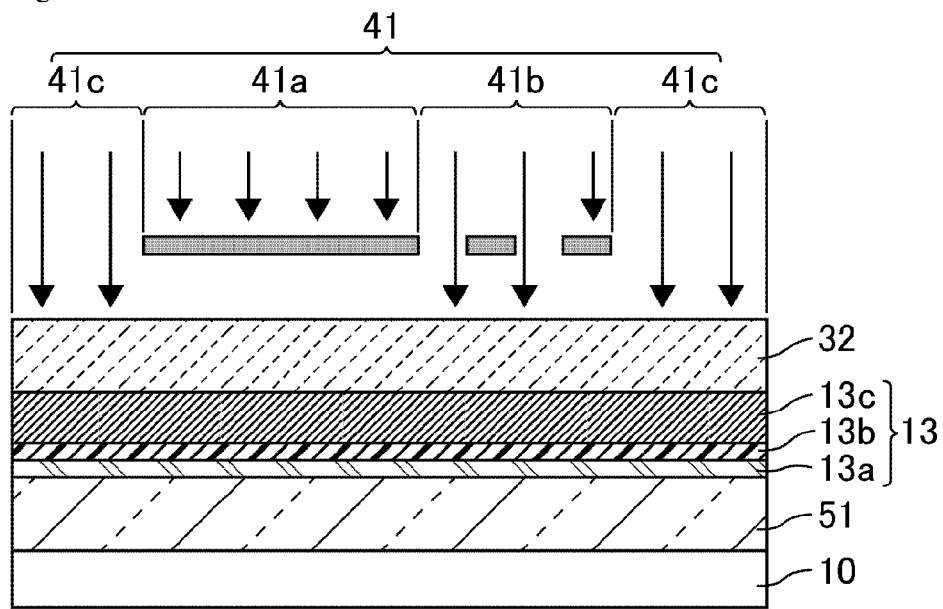
FIG. 7 is a schematic cross-sectional view illustrating a production flow of the main line portion and the coupling portion of the source wiring in Embodiment 1 and shows a stage in which exposure is conducted

First, as illustrated in FIG. 5, a glass substrate 10 on which a gate insulating film 51 is formed is prepared. Here, formation of the gate wiring and the semiconductor is already completed and is not shown in FIG. 5. Next, as illustrated in FIG. 6, the ITO layer 13a, the Ti layer 13b, and the Al layer 13c are sequentially formed on the gate insulating film 51 by sputtering. Then, as illustrated in FIG. 7, after application of a resist 32 for processing to the entire surface, exposure is conducted through a mask 41. At that time, the mask 41 is arranged in such a manner that a light shielding portion 41a is arranged at a position overlapping with an area where the main line portion of the source wiring 13 is to be formed, that a half-tone portion 41b is arranged at a position overlapping with an area where the coupling portions of the source wiring 13 are to be formed, and that a translucent portion 41c is arranged at a position overlapping with an area where the source wiring is not formed. In the present production method, a positive tone resist is used as the resist 32.

The half-tone portion 41b of the mask 41 can be formed, for example, by finely forming a plurality of slits or using a gray tone (diluted color), thereby reducing the amount of transmitted light to adjust the exposure amount.

Figure 8:
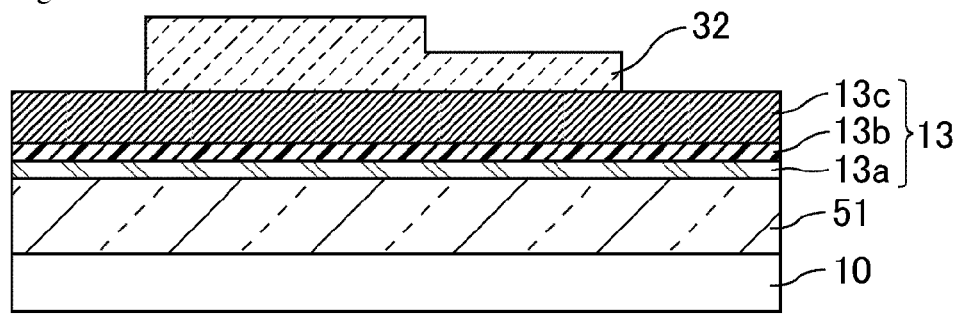
FIG. 8 is a schematic cross-sectional view illustrating a production flow of the main line portion and the coupling portion of the source wiring in Embodiment 1 and shows a stage in which development is conducted.

Next, as illustrated in FIG. 8, the development is conducted so that only the resist 32 in required parts is left and the rest of the resist 32 is removed. The thickness of the resist 32 is controlled by the exposure amount in the exposure treatment mentioned above. Therefore, a part exposed through the half-tone portion 41b of the mask 41 has the resist 32 thicker than that of an unexposed part covered with the light shielding portion 41a of the mask 41. The exposure amount is preferably adjusted such that the exposure amount of the half-tone portion 31b of the mask 41 is substantially half the exposure amount of the translucent portion 41c.

Figure 9:
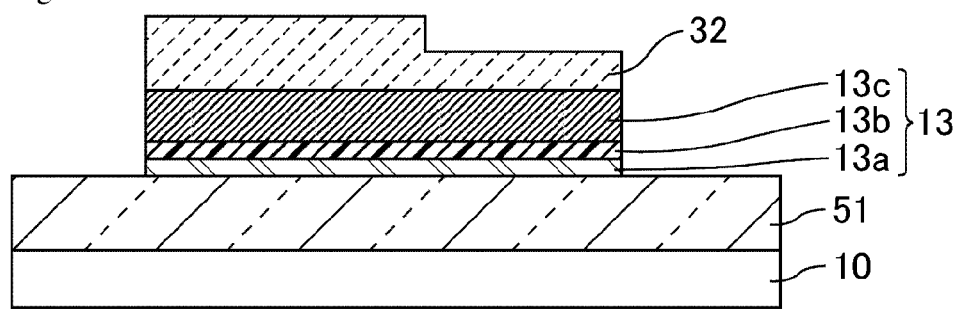
FIG. 9 is a schematic cross-sectional view illustrating a production flow of the main line portion and the coupling portion of the source wiring in Embodiment 1 and shows a stage in which etching is conducted.

Next, as illustrated in FIG. 9, etching is conducted so that layers positioned above the gate insulating film 51, namely the ITO layer 13a, the Ti layer 13b, and the Al layer 13c, are removed. A chlorinated gas is used to etch the Ti layer 13b and the Al layer 13c and oxalic acid is used to etch the ITO layer 13a. In this manner, the layers are removed. Depending on the kind of the chlorinated gas, the ITO layer 13a can be etched together.

Figure 10:
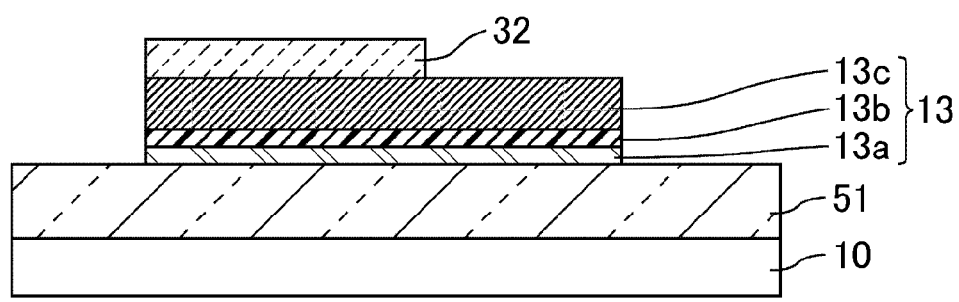
FIG. 10 is a schematic cross-sectional view illustrating a production flow of the main line portion and the coupling portion of the source wiring in Embodiment 1 and shows a stage in which a resist is partially removed.

As illustrated in FIG. 10, oxygen ashing is conducted so as to etch back the resist 32. The resist 32 is removed, until the part exposed through the half-tone portion 41b is all removed.

Figure 11:
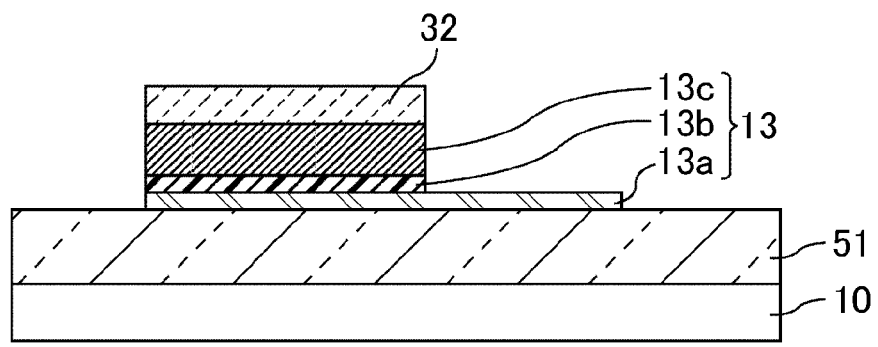
FIG. 11 is a schematic cross-sectional view illustrating a production flow of the main line portion and the coupling portion of the source wiring in Embodiment 1 and shows a stage in which a coupling portion of the source wiring is formed.

As illustrated in FIG. 11, dry etching using a chlorinated gas is conducted so that only the Ti layer 13b and the Al layer 13c are removed and the surface of the ITO layer 13a (the coupling portions of the source wiring) is exposed. If the etching using a chlorinated gas may damage the ITO layer 13a or the etching selectivity relative to the Ti layer 13b is not appropriate, the Ti layer 13b may be etched using a fluorogas.

Figure 12:
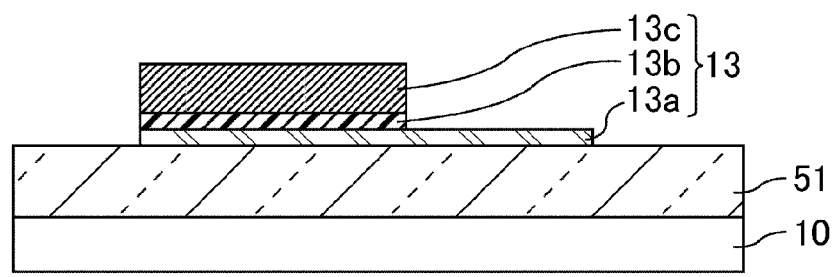
FIG. 12 is a schematic cross-sectional view illustrating a production flow of the main line portion and the coupling portion of the source wiring in Embodiment 1 and shows a stage in which a main line portion of the source wiring is formed.

As illustrated in FIG. 12, etching is conducted by removal of the resist 32 or oxygen ashing until the surface of the Al layer 13c (the main line portion of the source wiring) is exposed.

Figure 13:
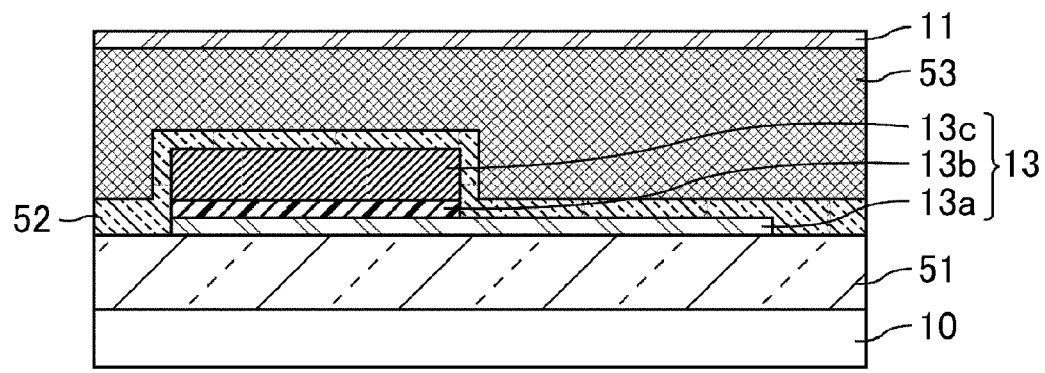
FIG. 13 is a schematic cross-sectional view illustrating a production flow of the main line portion and the coupling portion of the source wiring in Embodiment 1 and shows a stage in which a pixel electrode is formed.

As illustrated in FIG. 13, after formation of a passivation film 52 on the source wiring, an interlayer insulating film 53 is formed on the passivation film 52. Exemplary materials of the gate insulating film 51 include silicon nitride ($SiN_x$) and silicon oxide ($SiO_2$). Exemplary materials of the passivation film 52 include silicon nitride ($SiN_x$) and silicon oxide ($SiO_2$). Exemplary materials of the interlayer insulating film 53 include acrylic resins. Then, the pixel electrode 11 is formed using ITO.

In this manner, the source wiring 13 is produced which comprises the coupling portions 13B formed only of a translucent conductive material and the main line portion 13A formed of a light-shielding conductive material that has a specific resistance lower than that of the translucent conductive material is produced.

The whole wiring is allowed to have a lower resistance value compared to the wiring formed only of ITO because the specific resistance is low in some portions. On the other hand, ITO contributes to formation of the coupling capacitance in addition to light transmission, and therefore, the area for forming the coupling capacitance is secured.

Figure 14:
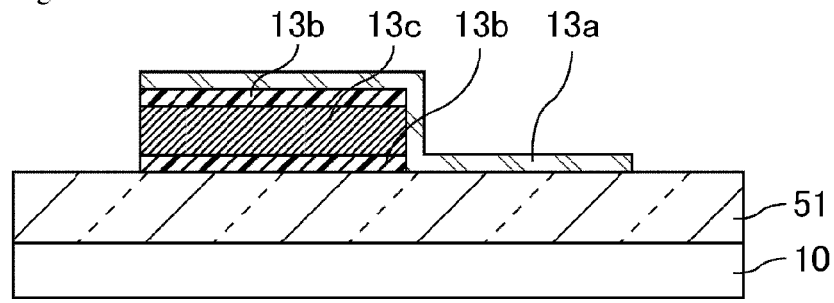
FIG. 14 is a schematic cross-sectional view of a modified example of Embodiment 1.

As illustrated in FIG. 14, a source wiring in which the ITO layer 13a is formed as a topmost layer of the main line portion may be used as a modified example of Embodiment 1. In such a case, the main line portion of the source wiring preferably has a configuration in which the Ti layer 13b, the Al layer 13c, the Ti layer 13b, and the ITO layer 13a are sequentially stacked on the glass substrate 10 in this order. FIG. 14 is a schematic cross-sectional view of a modified example of Embodiment 1.

In the above modified example, patterning is once conducted after stacking of the Ti layer 13b, the Al layer 13c, and the Ti layer 13b. Then, the ITO layer 13a is to be formed. Accordingly, compared to the method of Embodiment 1 in which the entire body is patterned using a half-tone mask at once after continuous sputtering of the ITO layer, the Ti layer, and the Al layer, the production step of patterning of the ITO layer is increased. However, the effect similar to that of Embodiment 1 is exerted with regard to formation of the coupling capacitance and reduction in the internal reflection.

FIG. 15 is a schematic cross-sectional view illustrating the layers of the display device of Embodiment 1 and also shows refractive indexes thereof.

As illustrated in FIG. 15, the liquid crystal display panel of Embodiment 1 has a configuration in which a polarizer (refractive index n=1.5), a glass substrate (refractive index n=1.5), a gate insulating film ($SiN_x$: refractive index n=2.0), a passivation film ($SiN_x$: refractive index n=2.0), an ITO layer (refractive index n=1.9), an Al layer, an interlayer insulating film (acrylic resin: refractive index n=1.5), an ITO layer (refractive index n=1.9), a liquid crystal layer (refractive index n=1.5), an ITO layer (refractive index n=1.9), a color filter (CF) resin (refractive index n=1.5), a glass substrate (refractive index n=1.5), and a polarizer (refractive index n=1.5) are stacked in this order from the back side towards the screen side.

In Embodiment 1, the coupling portions of the source wiring and the pixel electrodes are formed of the ITO layer. Between the coupling portions of the source wiring and the pixel electrodes, an interlayer insulating film is provided which has a refractive index (n=1.5) different from the refractive index (n=1.9) of the ITO layer. Therefore, different from a conventional case where a passivation film (refractive index n=2.0) formed of $SiN_x$ and an interlayer insulating film (refractive index n=1.5) formed of an acrylic resin are directly in contact with each other, an ITO layer (refractive index n=1.9) having a refractive index between the refractive indexes of the above layers is sandwiched between the above layers in Embodiment 1. Therefore, variation in the refractive index is more moderate than that in the conventional case where the passivation film and the interlayer insulating film are directly in contact with each other. As a result, reflection is less likely to occur in Embodiment 1.

Specifically, the reflection R occurring on the interface between a layer having a refractive index of 1.5 and a layer having a refractive index of 2.0 is $(2.0-1.5)^2/(2.0+1.5)^2=2.0\%$. The reflection R occurring on the interface between a layer having a refractive index of 1.5 and a layer having a refractive index of 1.9 is $(1.9-1.5)^2/(1.9+1.5)^2=1.4\%$. The reflection R occurring on the interface between a layer having a refractive index of 1.9 and a layer having a refractive index of 2.0 is $(2.0-1.9)^2/(2.0+1.9)^2=0.00066\%$. Accordingly, the effect of reducing the reflection is almost 0.6% (2.0−1.4−0.00066) as a whole. Here, a spectral colorimeter CMI-2002 (Konica Minolta Holdings, Inc) may be used to determine the refractive index.

In the following, a production method of the active matrix substrate of Embodiment 1 is described with reference to plan views. FIGS. 16 to 26 are schematic plan views illustrating a production flow of the active matrix substrate in Embodiment 1 and each drawing shows a production stage.

On a glass substrate prepared, a Ti layer, an Al layer, and a Ti layer are sequentially formed by sputtering. A resist is applied thereto and pre-baked. A mask is set in such a manner that an area where a gate wiring and a CS wiring are to be formed is shaded by a light-shielding portion of the mask. The resist is exposed and developed. Subsequently, dry etching is conducted so that a laminate of the Ti layer, the Al layer, and the Ti layer is partially trimmed. In accordance with the resist pattern, the wiring pattern is formed. Then, the resist is removed and the gate wiring 12 and the CS wiring 17 are patterned.

Figure 17:
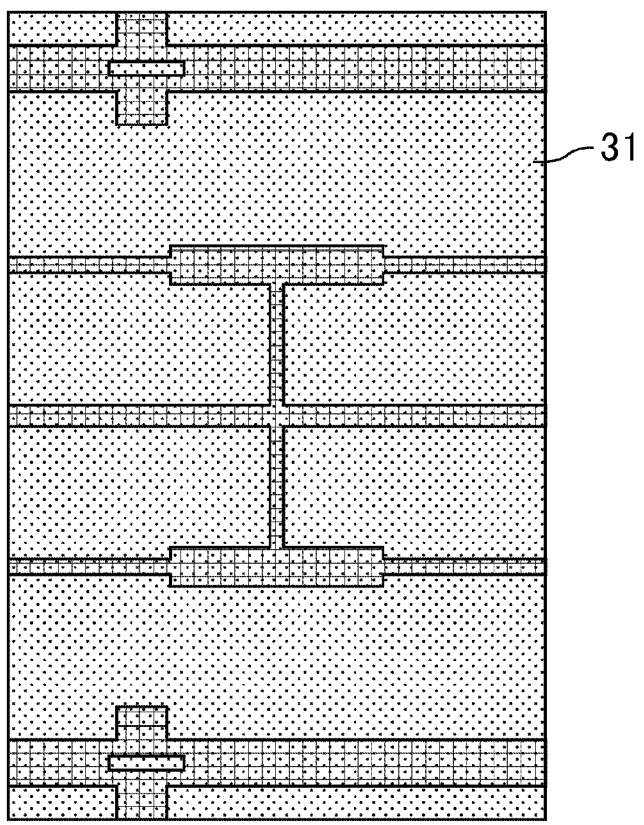
FIG. 17 is a schematic plan view illustrating a production flow of the active matrix substrate in Embodiment 1 and shows a stage in which a $SiN_x$ layer, an a-Si layer, and an $n^+Si$ layer are formed.

As illustrated in FIG. 17, on the entire body including the gate wiring 12 and the CS wiring 17, a $SiN_x$ layer for forming a gate insulating film, an a-Si (amorphous silicon) layer and $n^+Si$ (nitrogen doped silicon) layer 31 for forming a semiconductor layer are sequentially formed. The $SiN_x$ layer, the a-Si layer, and the $n^+Si$ layer 31 may be formed by, for example, a CVD (Chemical Vapor Deposition) method.

Figure 18:
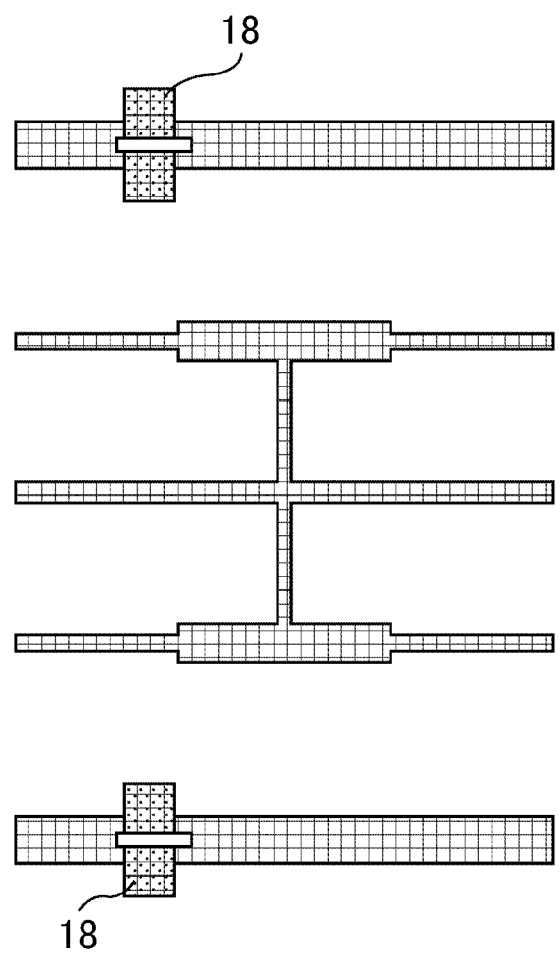
FIG. 18 is a schematic plan view illustrating a production flow of the active matrix substrate in Embodiment 1 and shows a stage in which a semiconductor layer is formed.

A resist is applied onto the $n^+Si$ layer. The mask is set in such a manner that an area where a semiconductor layer of the TFT is to be formed is shaded. The resist is exposed and developed. Subsequently, dry etching is conducted so that a laminate of the a-Si layer and $n^+Si$ layer is partially trimmed. The a-Si layer and $n^+Si$ layer are left in some portions in accordance with the resist pattern, so that a semiconductor layer 18 is formed as illustrated in FIG. 18.

Figure 19:
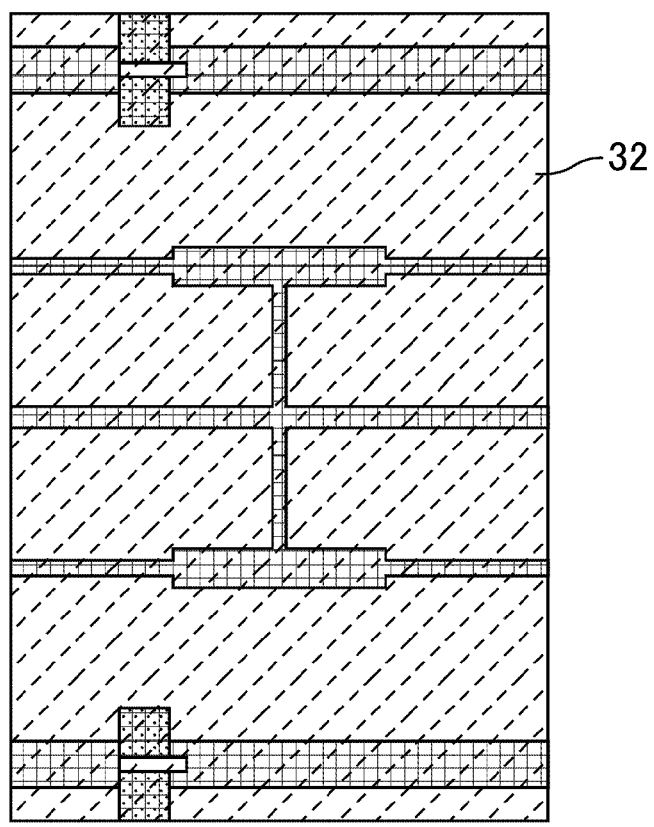
FIG. 19 is a schematic plan view illustrating a production flow of the active matrix substrate in Embodiment 1 and shows a stage in which a transparent conductive layer and a metallic layer which is to be the source wiring are formed and the resist is applied thereon.

Next, an ITO layer, a Ti layer, and an Al layer are continuously formed by sputtering. Further, the resist 32 is applied to the entire body as illustrated in FIG. 19.

The resist 32 is pre-baked. The mask is set in such a manner that the light shielding portion of the mask is arranged on the position overlapping with an area where the main line portion of the source wiring is to be formed and that the half-tone portion of the mask is arranged on the position overlapping with an area where the coupling portion of the source wiring is to be formed and with an area where the drain wiring is to be formed. Then, exposure and development are conducted. In this manner, the resist is formed thinner in areas overlapping with the coupling portion of the source wiring and the drain wiring.

In a part where the resist 32 is irradiated with a predetermined amount of light, the resist 32 is dissolved by a developing solution. Therefore, in a part where exposure is conducted and a part where exposure is insufficiently conducted, the resist is dissolved in the development so that an area where the resist is left, an area where less resist is left so as to be thinner, and an area where no resist is left are formed.

Figure 20:
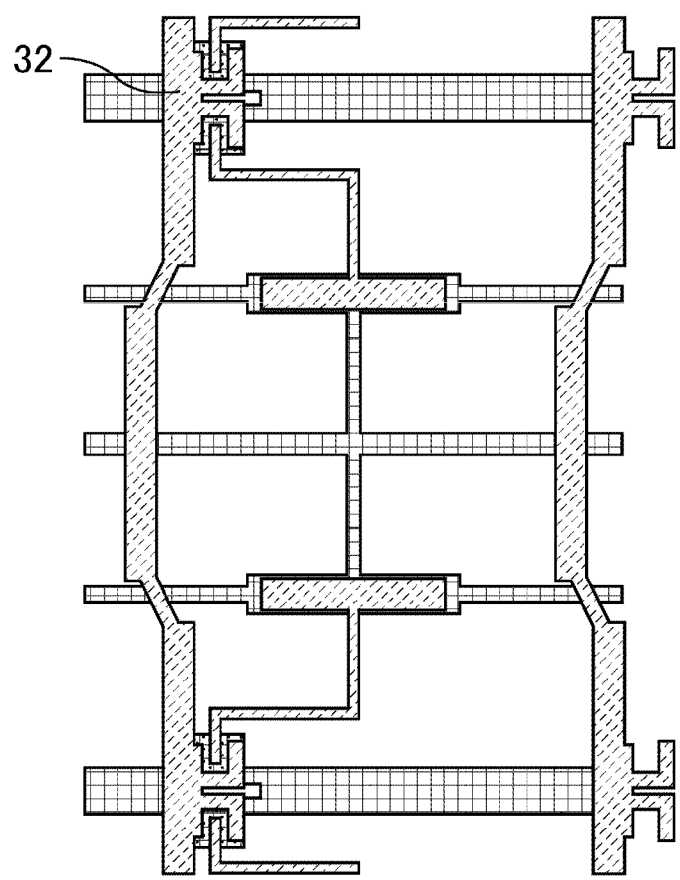
FIG. 20 is a schematic plan view illustrating a production flow of the active matrix substrate in Embodiment 1 and shows a stage in which the transparent conductive layer and the metallic layer which is to be the source wiring are partially etched after exposure and development.
Figure 21:
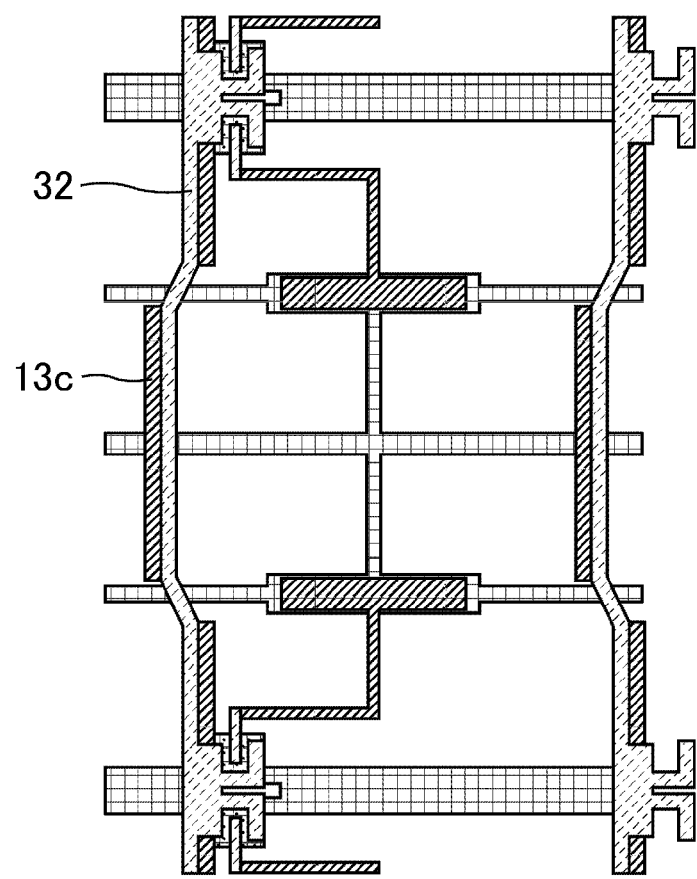
FIG. 21 is a schematic plan view illustrating a production flow of the active matrix substrate in Embodiment 1 and shows a stage in which a resist is partially removed.

Next, the metal wiring having a laminate configuration is partially removed. As illustrated in FIG. 20, a part of a metallic layer to be formed into the source wiring comprising the ITO layer, the Ti layer, and the Al layer, and also into the drain wiring is partially etched. Next, oxygen ashing is conducted to remove the resist until the resist 32 half-exposed is completely removed as illustrated in FIG. 21. The half-exposed area is an area where less resist is left so that the thickness thereof is smaller. Therefore, even if the half-exposed resist is completely removed, the resist 32 is still left in the exposed area. This allows the Al layer 13c to be exposed on the surface.

Figure 22:
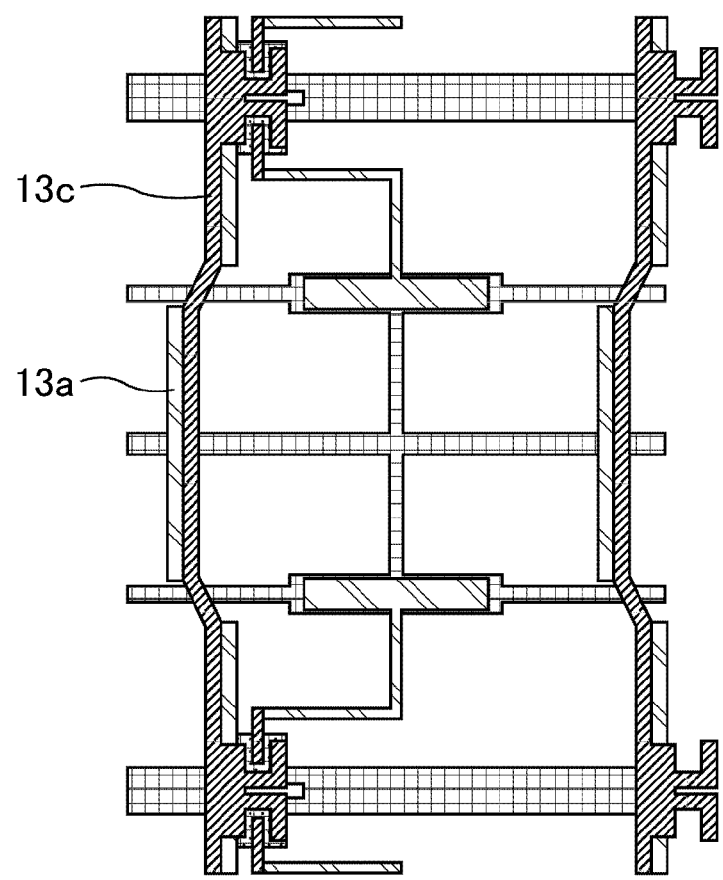
FIG. 22 is a schematic plan view illustrating a production flow of the active matrix substrate in Embodiment 1 and shows a stage in which the source wiring is formed.

As illustrated in FIG. 22, the metal wiring in the half-exposed area is etched until the surface of the ITO layer 13a is exposed. The Ti layer and the Al layer can be removed by dry etching using a chlorinated gas. The etching using a chlorinated gas may damage the ITO layer 13a or accidentally etch the ITO layer 13a. Therefore, adjustment of the etching selectivity between the ITO layer 13a and the Ti layer 13b is needed by appropriately changing the chlorinated gas to a fluorine-based etching gas or a fluorine-containing chlorinated gas. ITO is less likely to be damaged by a fluorogas. Subsequently, the $n^+$silicon layer remaining between the source and the drain of a semiconductor element is etched by a fluorogas. This exposes the surface of the ITO layer 13a and forms the coupling portions of the source wiring. Finally, the resist is removed so that the surface of the Al layer 13c is exposed. In this manner, the source wiring is formed.

Figure 23:
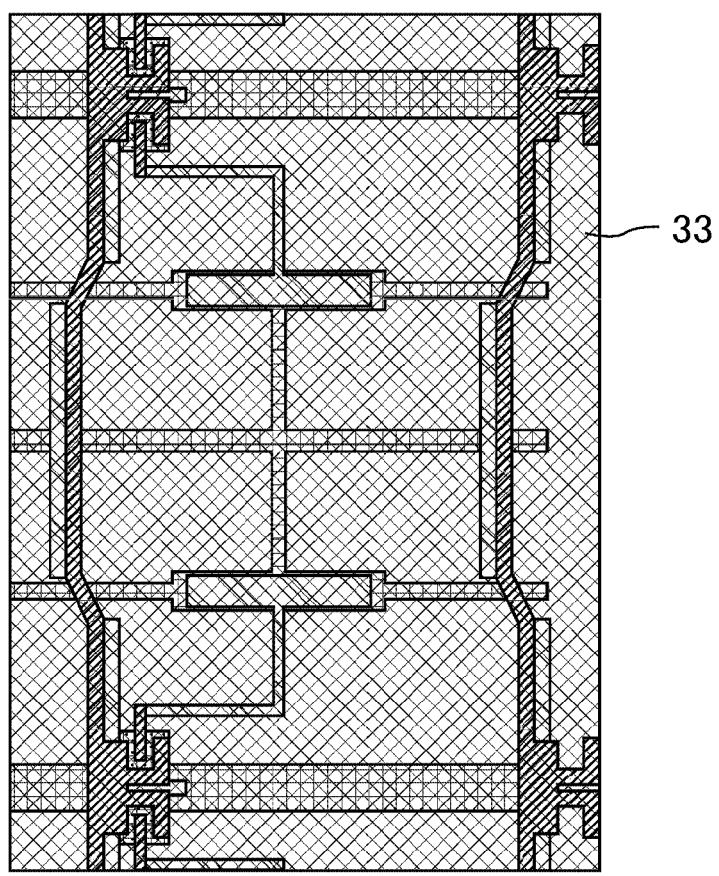
FIG. 23 is a schematic plan view illustrating a production flow of the active matrix substrate in Embodiment 1 and shows a stage in which an acrylic resist is applied.
Figure 24:
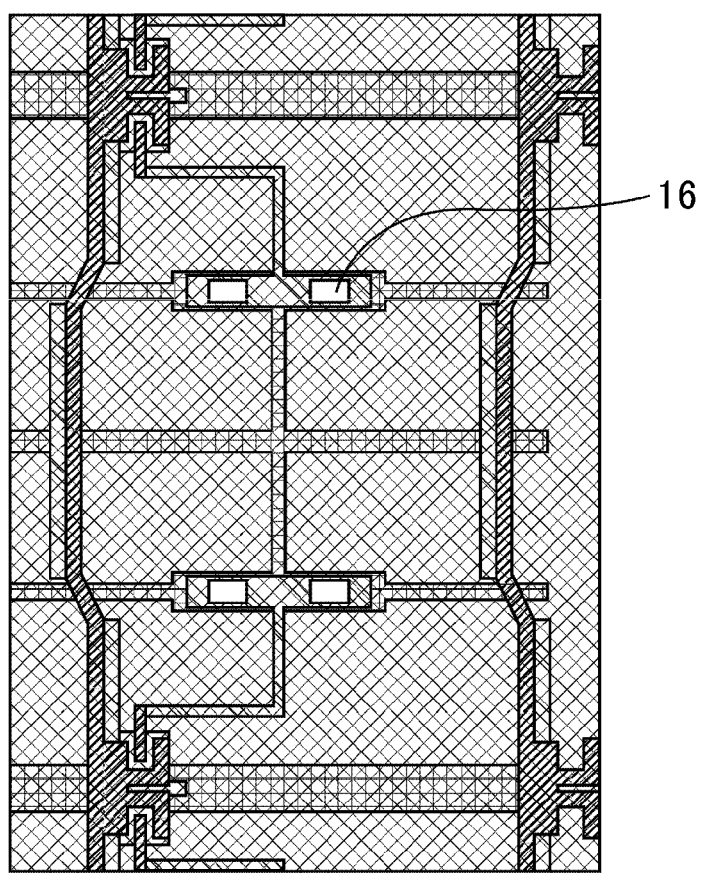
FIG. 24 is a schematic plan view illustrating a production flow of the active matrix substrate in Embodiment 1 and shows a stage in which exposure and development are conducted.

After formation of the passivation film ($SiN_x$) on the entire surface, as illustrated in FIG. 23, an acrylic resist 33 for forming the interlayer insulating film is applied. The mask is set in such a manner that the translucent portion of the mask is positioned on the area where a contact hole connecting the pixel electrode and the drain wiring is to be formed. Then, exposure and development are conducted. Accordingly, as illustrated in FIG. 24, a contact hole 16 is formed in the interlayer insulating film. At that time, the inner wall of the contact hole 16 is tapered (angled) utilizing shrinkage of the resist by post baking. This prevents formation of a discontinuity in the ITO layer that is formed on the inner wall of the contact hole 16. The passivation film exposing on the contact hole is removed by dry etching and the Al layer exposed on the surface through the contact hole 16 is removed by wet etching. Accordingly, the Ti layer is exposed and the interlayer insulating film 53 is formed. Since Al has a higher reflectance than Ti, the internal reflection is further reduced by the above treatment.

Figure 25:
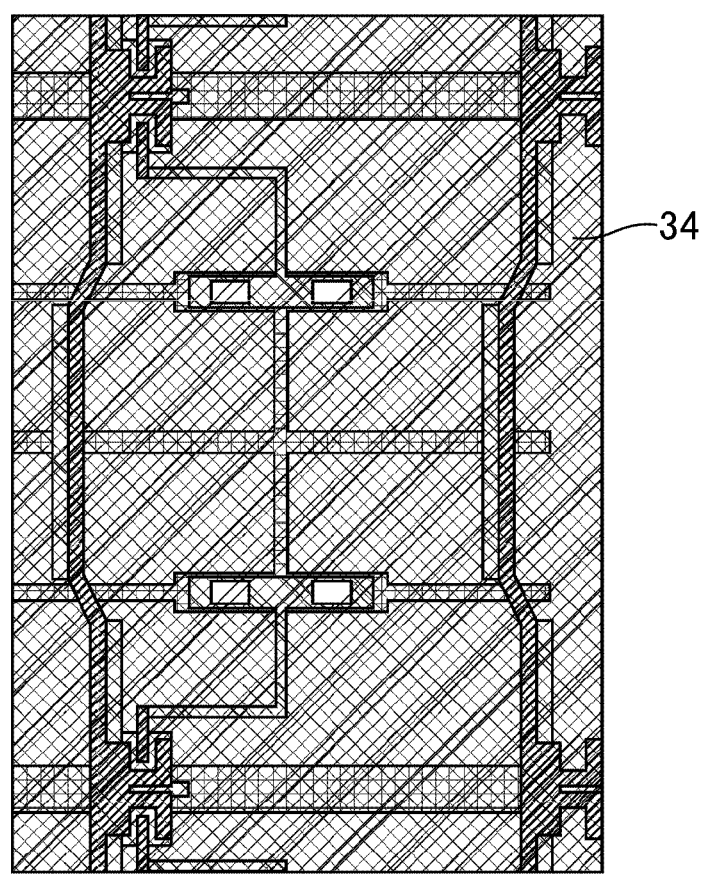
FIG. 25 is a schematic plan view illustrating a production flow of the active matrix substrate in Embodiment 1 and shows a stage in which an ITO layer is formed.

As illustrated in FIG. 25, an ITO layer 34 is formed by sputtering on the entire body including the insulating film 53 and the Ti layer exposed on the surface through the contact hole 16.

Figure 26:
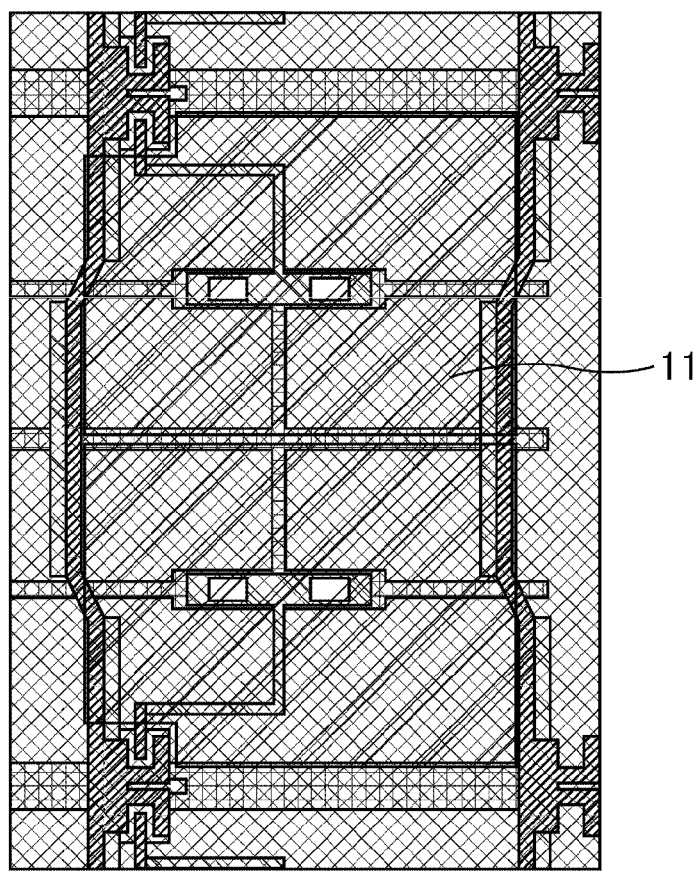
FIG. 26 is a schematic plan view illustrating a production flow of the active matrix substrate in Embodiment 1 and shows a stage in which a pixel electrode is formed.

As illustrated in FIG. 26, the ITO layer 34 is patterned into a desired shape by photolithography so that the pixel electrodes 11 are formed. In FIG. 26, only the pixel electrodes 11 in two pixels are shown for illustration purposes.

Reference Embodiment 1

Reference Embodiment 1 is an example of a display device comprising an active matrix substrate in which coupling portions of a source wiring is not formed of a transparent material. The display device of Reference Embodiment 1 comprises a pair of substrates including an active matrix substrate with a pixel electrode, a TFT, and the like and a color filter substrate with a color filter, a black matrix, and the like, and a liquid crystal layer sandwiched between the substrates.

Figure 27:
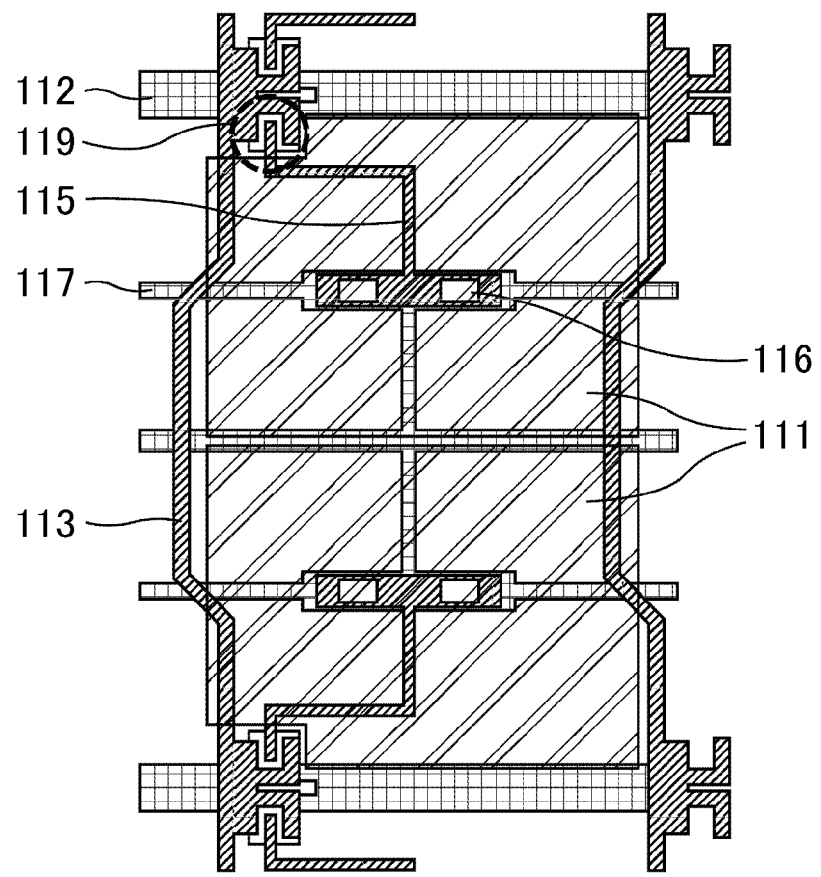
FIG. 27 is an enlarged view schematically illustrating a source wiring of an active matrix substrate of Reference Embodiment 1.

FIG. 27 is an enlarged view schematically illustrating a source wiring of an active matrix substrate of Reference Embodiment 1. The source wiring 13 has a zigzag shape as a whole. The source wiring 13 has a bent portion. A crossing part is formed from that bent portion in such a manner as to cross a space between two pixel electrodes 11 adjacent to each other in the row direction. This configuration allows a single source wiring 13 to overlap with two pixel electrodes 11 adjacent to each other. In Reference Embodiment 1, in comparison with the case where a source wiring has a linear shape, the overlapping area of the source wiring 13 and the pixel electrode 11 is larger. Therefore, even when misalignment occurs, it is possible to suppress variation in the coupling capacitance formed between the pixel electrode 11 and the source wiring 13 among the pixel electrodes 11.

However, in Reference Embodiment 1, both the source wiring 13 and the drain wiring 15 are formed of a conductive material having reflectivity such as aluminum (Al). Moreover, since the source wiring 13 and the drain wiring 15 are present in the display area without covered with a black matrix, light may be reflected on the surfaces of the source wiring 13 and the drain wiring 15. This may cause internal reflection, possibly resulting in the lowered display quality.

Figure 28:
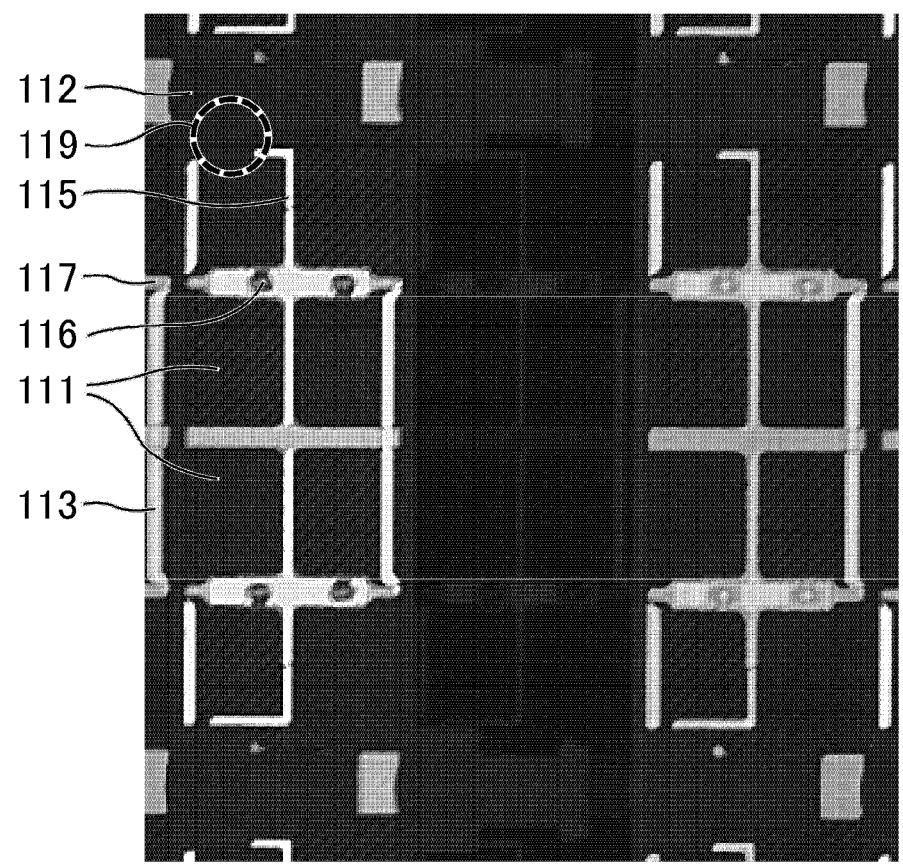
FIG. 28 is an optical microscope image of the active matrix substrate of Reference Embodiment 1.

FIG. 28 is an optical microscope image of the active matrix substrate of Reference Embodiment 1. A white part in FIG. 28 indicates an area where internal reflection occurs. This image shows that the source wiring, the drain wiring, and the CS wiring mainly cause internal reflection. In FIG. 28, different color filters each correspond to an area surrounded by the gate wiring and the source wiring. Three areas in the drawing each indicate red, green, and blue from the left.

Embodiment 2

Embodiment 2 is an example of the display device of the present invention in which the active matrix substrate of the present invention is used. The display device of Embodiment 2 is similar to the display device of Embodiment 1, except that the source wiring has a linear shape instead of a zigzag shape, the coupling portion is longer, and the center part of the main line portion is removed.

Figure 29:
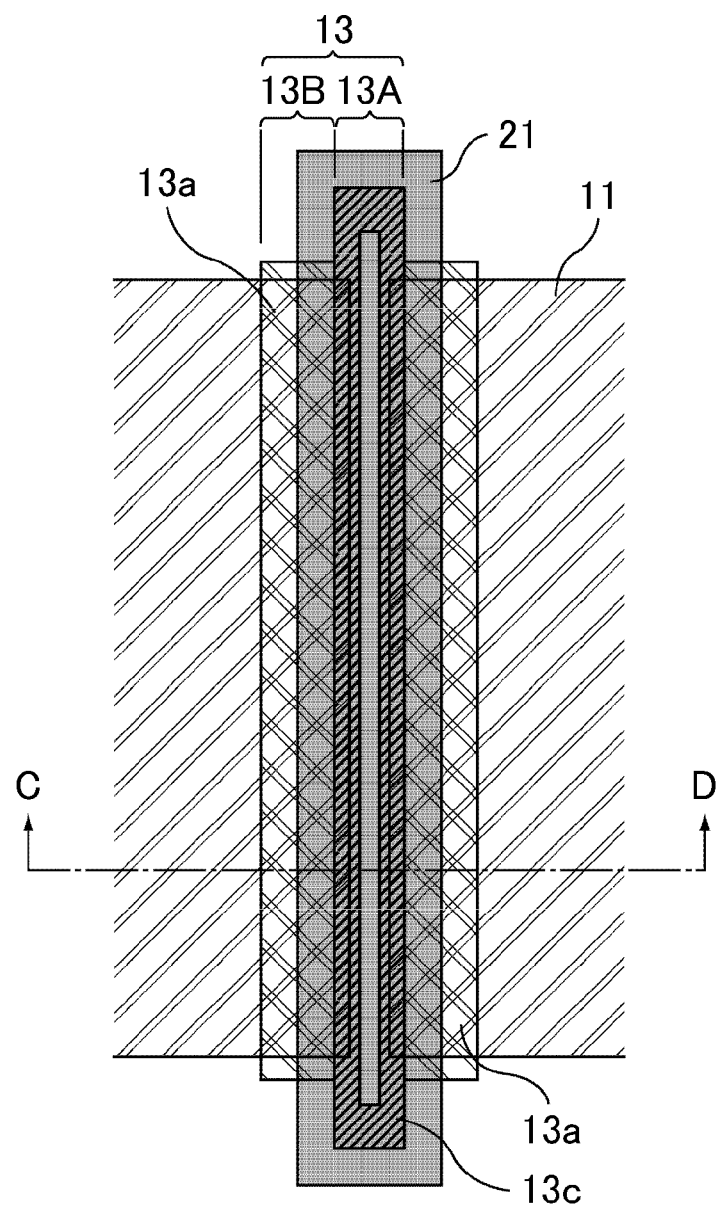
FIG. 29 is an enlarged view schematically illustrating a source wiring of an active matrix substrate in Embodiment 2.

FIG. 29 is an enlarged view schematically illustrating a source wiring of an active matrix substrate in Embodiment 2. The source wiring 13 has a linear main line portion 13A in which a center part is removed and extension portions (coupling portions) 13B respectively extending to a predetermined area from the both sides of the main line portion 13A. The coupling portions 13B are respectively provided on the right and left of the source wiring 13. The length of each of the coupling portions 13 is substantially the same as the length of the pixel electrode 11. The area of the coupling portion 13B on the left and the area of the coupling portion 13B on the right are substantially the same. The shapes of the coupling portions 13B are each a rectangular shape.

According to Embodiment 2, the interval between the adjacent pixel electrodes can be further narrowed compared to that in Embodiment 1. Additionally, the width of the black matrix can be also narrowed. Consequently, the aperture ratio can be improved. Moreover, the proportional area of the coupling portions 13B relative to the entire source wiring 13 is larger than that in Embodiment 1, and therefore, variation in the coupling capacitance is further reduced.

Figure 30:
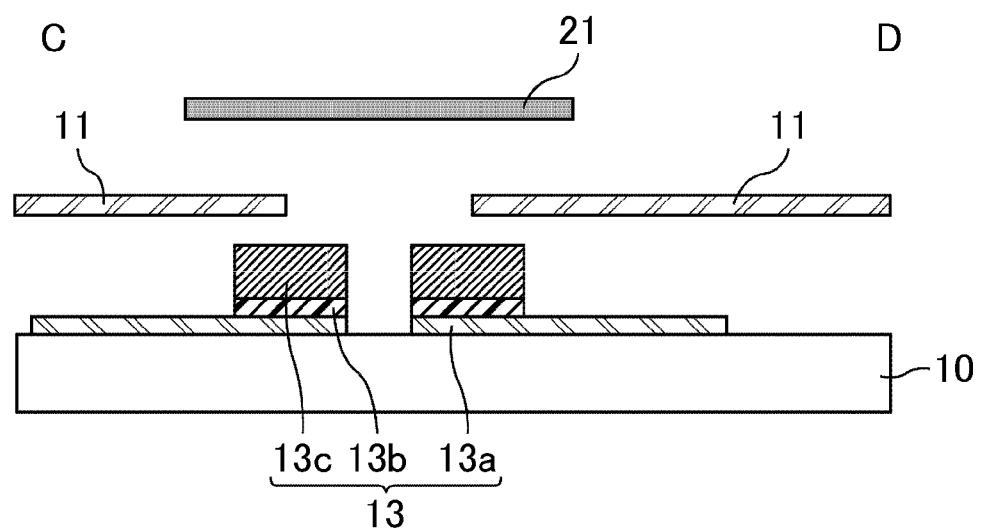
FIG. 30 is a cross-sectional view taken along a C-D line in FIG. 29.

FIG. 30 is a cross-sectional view taken along a C-D line in FIG. 29. As illustrated in FIG. 30, the active matrix substrate in Embodiment 2 has a source wiring 13 and a pixel electrode 11 on a glass substrate 10. A black matrix 21 is arranged at a position covering an edge portion of each pixel electrode 11 of the counter substrate.

The main line portion of the source wiring 13 comprises a laminate of an ITO layer 13a, a Ti layer 13b, and an Al layer 13c. The coupling portions are formed only of the ITO layer 13a. Moreover, the center of the main line portion is hollowed.

Embodiment 3

Embodiment 3 is an example of the display device of the present invention in which the active matrix substrate of the present invention is used. The display device of Embodiment 3 is similar to the display device of Embodiment 1, except that the source wiring has a linear shape instead of a zigzag shape, and the shapes of the coupling portions extending from the source wiring is changed.

Figure 31:
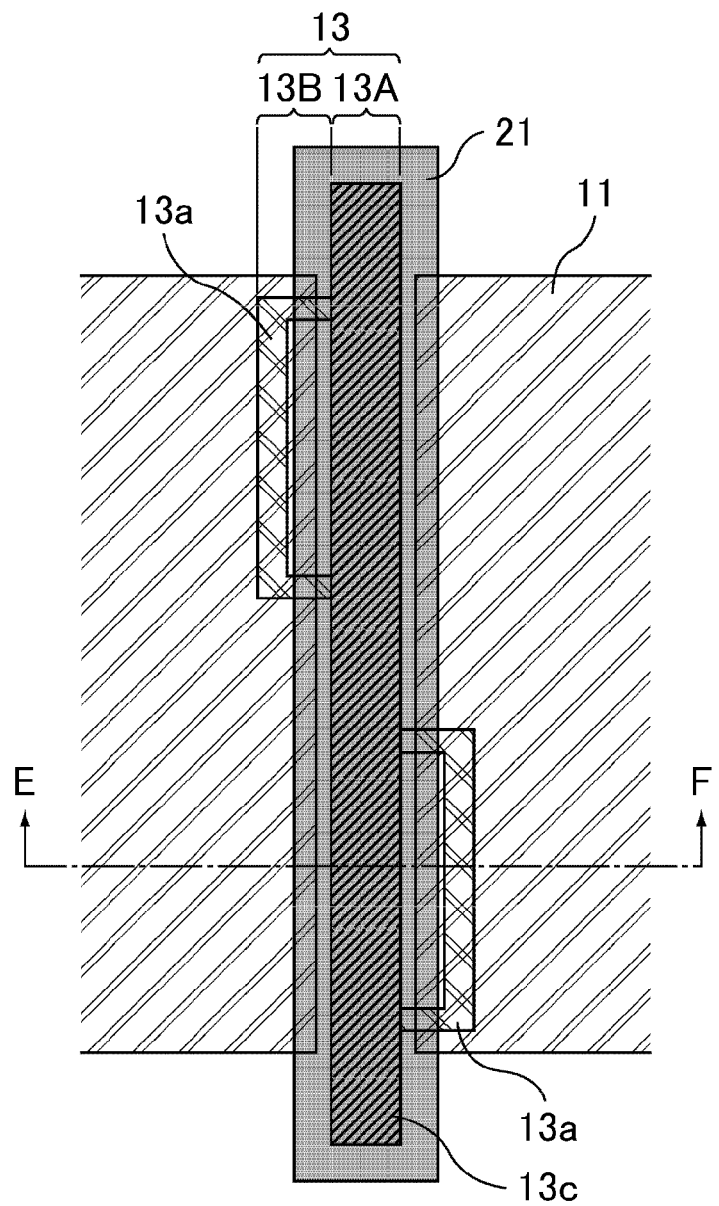
FIG. 31 is an enlarged view schematically illustrating a source wiring of an active matrix substrate in Embodiment 3.

FIG. 31 is an enlarged view schematically illustrating a source wiring of an active matrix substrate in Embodiment 3. The source wiring 13 has a linear main line portion 13A in which a center part is removed and extension portions (coupling portions) 13B respectively extending to a predetermined area from the both sides of the main line portion 13A. The coupling portions 13B are respectively provided on the right and left of the source wiring 13. The area of the coupling portion 13B on the left and the area of the coupling portion 13B on the right are substantially the same.

The coupling portions 13B each have a "]" shape (grip-like shape) in a plan view of the substrate. Each coupling portion 13B is formed by extending to a predetermined length in the row direction from the starting point of the main line portion of the source wiring and further extending in the column direction. Between the main line portion and each coupling portion, a space having a predetermined area is formed.

The coupling portion having such a shape allows well-balanced coupling capacitance even in the case where the adjacent pixel electrodes are positioned at an interval larger than the width of the source wiring. Therefore, this allows uniform application of the signal voltage to the pixel electrodes as well as improvement in the aperture ratio and suppression of the internal reflection.

In Embodiment 3, the effect similar to that of Embodiments 1 and 2 is exerted with regard to formation of the constant coupling capacitance and reduction in the internal reflection, though the aperture ratio is inferior to those in Embodiment 1 and 2

Figure 32:
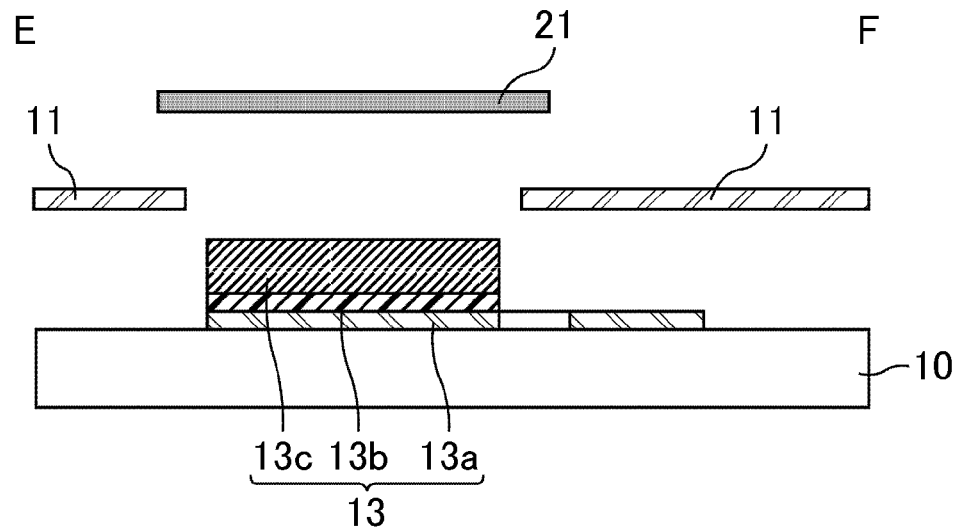
FIG. 32 is a cross-sectional view taken along an E-F line in FIG. 31.

FIG. 32 is a cross-sectional view taken along an E-F line in FIG. 31. As illustrated in FIG. 32, the active matrix substrate in Embodiment 2 has the source wiring 13 and the pixel electrode 11 on the glass substrate 10. In the counter substrate, a black matrix 21 is arranged at a position covering an edge portion of each pixel electrode 11.

The main line portion of the source wiring 13 comprises a laminate of an ITO layer 13a, a Ti layer 13b, and an Al layer 13c. The coupling portions are formed only of the ITO layer 13a.

Embodiment 4

Embodiment 4 is an example of the display device of the present invention in which the active matrix substrate of the present invention is used. The display device of Embodiment 4 has a protection board (front board) in front of the liquid crystal display panel and is similar to the liquid crystal display device of Embodiment 1, except that an antireflection film is attached to the protection board. According to the display device of Embodiment 4, the antireflection film is positioned at the top surface of members constituting the display face. Therefore, reflection of light on the surface of the protection board (surface reflection) is reduced and also the reflection caused by the internal configuration of the liquid crystal display panel (internal reflection) is reduced.

Figure 33:
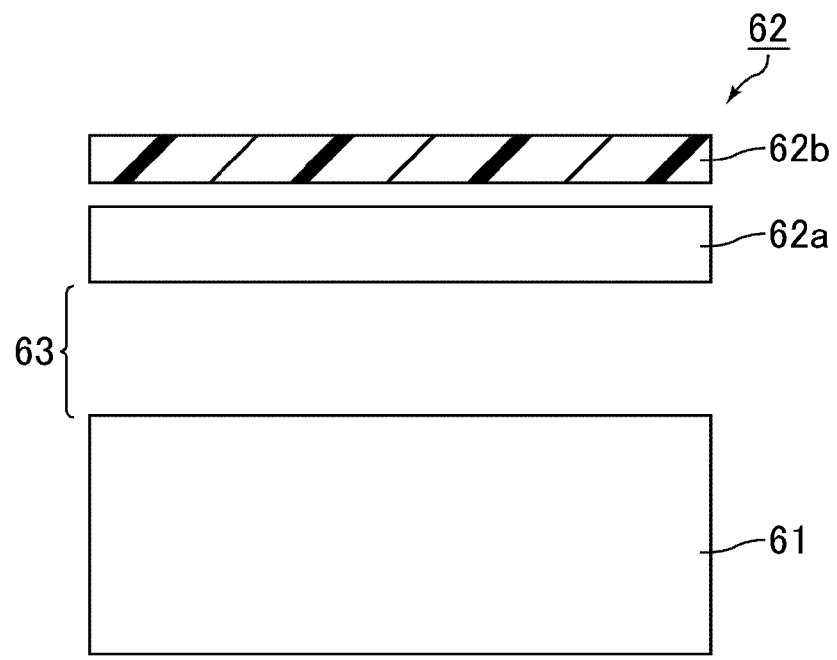
FIG. 33 is a cross-sectional view schematically illustrating a display device of Embodiment 4 in which an antireflection film (a light interference film) is placed on a protection board.
Figure 34:
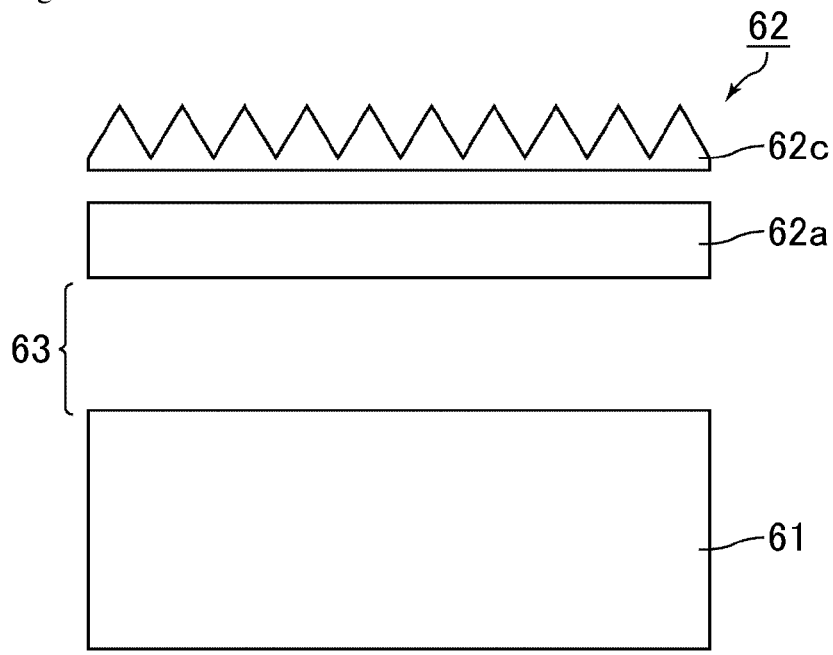
FIG. 34 is a cross-sectional view schematically illustrating the display device of Embodiment 4 in which an antireflection film (a moth-eye film) is placed on a protection board.

FIGS. 33 and 34 are cross-sectional views each schematically illustrating a display device of Embodiment 4 in which an antireflection film is placed on a protection board. FIG. 33 shows a case of using a film reducing reflected light by light interference (e.g. AR film or LR film) (hereinafter, also referred to as a light interference film). FIG. 34 shows a case of using a film having a plurality of protrusions positioned at a width of not more than the visible light wavelength between the adjacent top portions thereof on the surface (hereinafter, also referred to as a moth eye film).

As illustrated in FIGS. 33 and 34, the display device of Embodiment 4 has a liquid crystal display panel 61, a protection board 62 for protecting the liquid crystal display panel 61, and an air layer 63 sandwiched between them. The protection board 62 has a base 62a and one of a light interference film 62b and a moth eye film 102c on the base 62a. Exemplary materials of the base 62a include glass, acrylic resin, and methacrylic resin. Here, FIGS. 33 and 34 each show an embodiment where an antireflection film is provided only on one side of the protection board 62a. However, the antireflection film may be provided on both faces of the protection board 62 including the surface on the side facing the display panel 61 and the surface on the outer side of the display panel 61. In such a configuration, the reflections on both surfaces are respectively suppressed so that the reflectance is further reduced, leading to the improvement in the display quality. It is to be noted that the front face and the back face of the protection board 62a may have different antireflection films thereon.

The light interference film 62b is an antireflection film suppressing the reflection by reversing the phase of light reflected on the surface of the light interference film on the outer side and the phase of light reflected on the surface of the light interference film on the display panel side so that they interfere with each other to be extinguished. In the case where the light interference film 62b have a multilayer structure, light reflected on each interface in the multilayer structure, namely, inside the light interference film, may also be used as an interference material, in addition to the light reflected on the above surfaces.

The LR film is a monolayer film or a film constituted by a couple of layers and has a reflectance of 1% to 2%. Since having a simple layer structure, the LR film can be formed by wet application.

The AR film is commonly formed by a dry method. The AR film has a multilayer structure including 4 to 7 layers and has a reflectance of 0.2% to 4%. The AR film is not suitable for large applications because improvement in the film formation speed thereof is difficult and the productivity is poor. However, since being excellent in suppressing the reflection of external light, the AR film is favorably used in mobile devices and the like which are used under bright external light such as outdoors.

Figure 35:
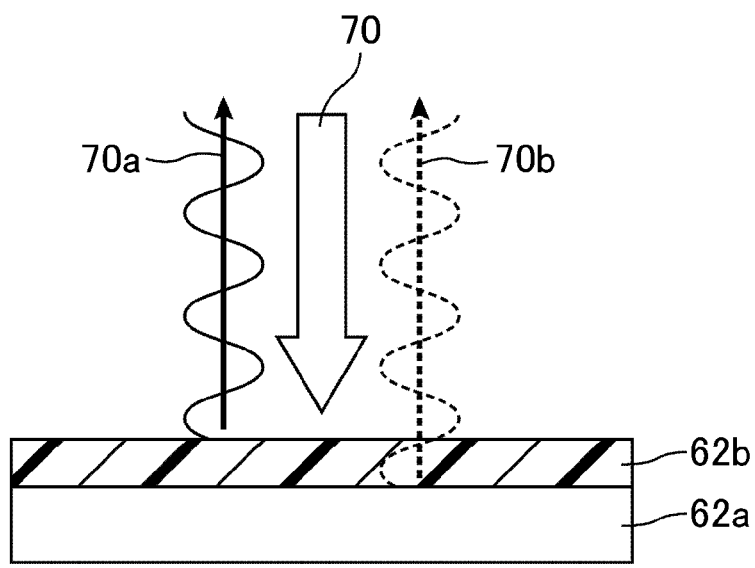
FIG. 35 is a schematic view illustrating a principle of realizing low reflection using a light interference film such as a LR film and an AR film.

FIG. 35 is a schematic view illustrating a principle of realizing low reflection using a light interference film such as a LR film and an AR film. As illustrated in FIG. 35, the light interference film 62b is provided on the base 62a. In such a case, light 70 entering the light interference film 62b is divided into an element 70a reflected on the outer-side surface of the light interference film 62b and an element 70b reflected on the base-side surface of the light interference film 62b. In the light interference film 62b, the phase of the element 70a reflected on the outer-side surface is designed to be shifted from the phase of the element 70b reflected on the base-side surface by N–½ (N being an integer of 1 or larger) wavelengths. This arrangement allows the element 70a reflected on the outer-side surface and the element 70b reflected on the base-side surface to be in opposite phases to each other. Accordingly, the both lights are distinguished by mutual interference, thereby reducing the reflectance.

Figure 36:
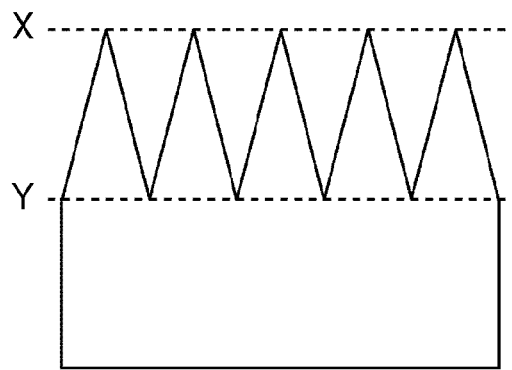
FIG. 36 is a schematic view illustrating a principle of realizing a low reflectance using a moth eye film and shows a cross section of the moth eye film.
Figure 37:
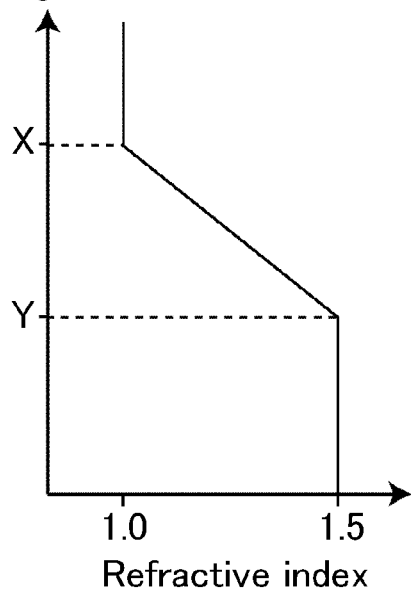
FIG. 37 is a schematic view illustrating a principle of realizing a low reflectance using a moth eye film and shows the refractive index of light entering the moth eye film.

FIGS. 36 and 37 are schematic views each illustrating a principle of realizing a low reflectance using a moth eye film and shows a cross section of the moth eye film. FIG. 36 shows a cross-sectional structure of a moth eye film and FIG. 37 shows a refractive index of light entering the moth eye film. When passing from one medium to another medium, light is refracted, transmitted, and reflected on the interface of the media. The degree of refraction depends on the refractive index of the medium in which the light passes. For example, air has a refractive index of about 1.0, and resin has a refractive index of about 1.5. In Embodiment 1, the unit structure of the protrusions and depressions formed on the surface of the moth eye film is a cone as a whole, namely, a shape in which the width is gradually narrowed towards the top. Accordingly, as illustrated in FIG. 37, in a protrusion (X-Y) positioned on the interface of the air layer and the moth eye film, the refractive index is continuously and gradually increased from about 1.0 that is the refractive index of air to the refractive index of the film-forming material (about 1.5 in the case of resin). The amount of reflected light depends on the difference in the refractive index between the media. Therefore, the refraction interface simulatively made not to exist as above allows almost all the light to pass through the moth eye film. Accordingly, the reflectance on the film surface is significantly reduced.

Namely, the moth eye film allows the change of the refractive index on from the surface of the base on the outer side to the surface of the base to be simulatively continuous, so that almost all the light is transmitted regardless of the refractive index interface. In this manner, the reflectance is lowered. Specifically, the moth eye film can reduce the reflectance to about 0.2%.

The moth eye film 62c has a plurality of protrusions positioned at a width (spacing) of not more than the visible light wavelength between the adjacent top portions thereof on the surface. Exemplary materials of the moth eye film 62c include resins that are capable of conducting UV nanoimprint and thermal nanoimprint and are curable under predetermined conditions. In particular, photocurable resins such as acrylate resin and methacrylate resin are preferable which can conduct UV nanoimprint for precise patterning.

Figure 38:
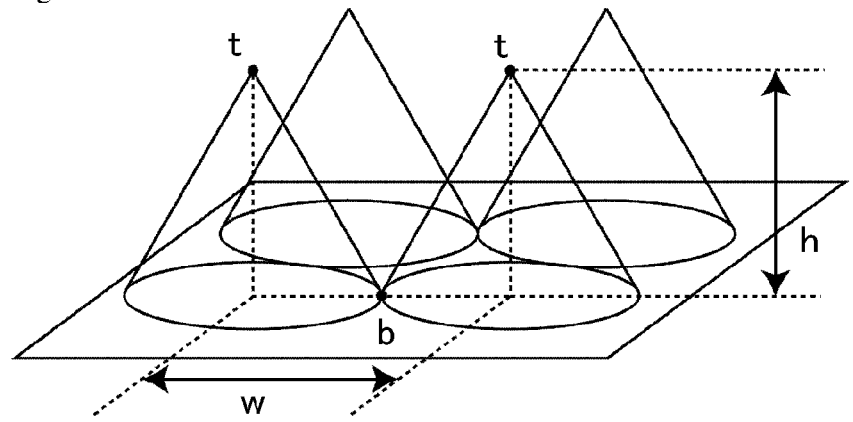
FIG. 38 is an enlarged perspective view illustrating a surface of the moth eye film in a display device of Embodiment 4 and shows the case where the unit structure of protrusions is a cone.
Figure 39:
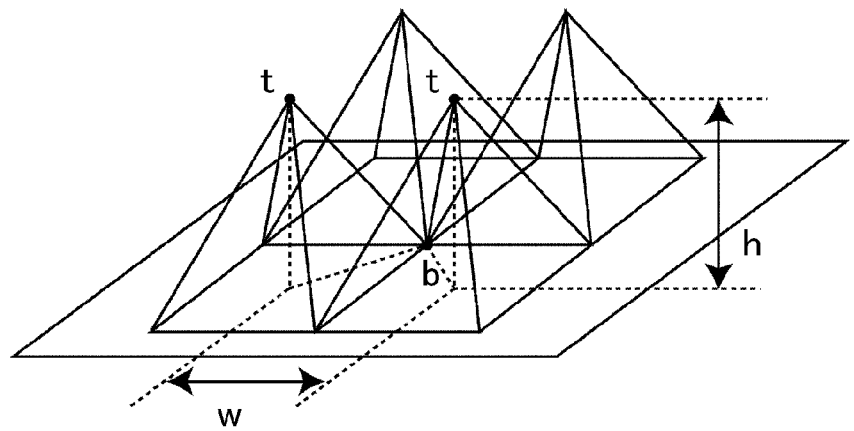
FIG. 39 is an enlarged perspective view illustrating a surface of the moth eye film in a display device of Embodiment 4 and shows the case where the unit structure of protrusions is a quadrangular pyramid.
Figure 40:
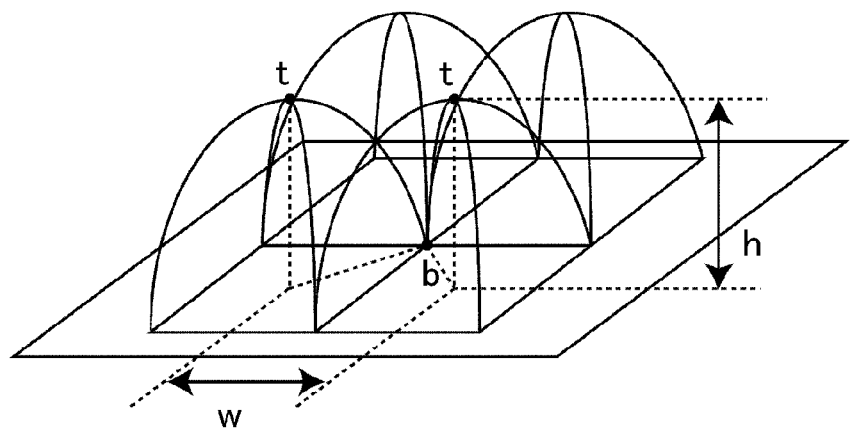
FIG. 40 is an enlarged perspective view illustrating a surface of the moth eye film in a display device of Embodiment 4 and shows the case where the unit structure of protrusions is a dome (bell) in which a slope from the top to the bottom is rounded.
Figure 41:
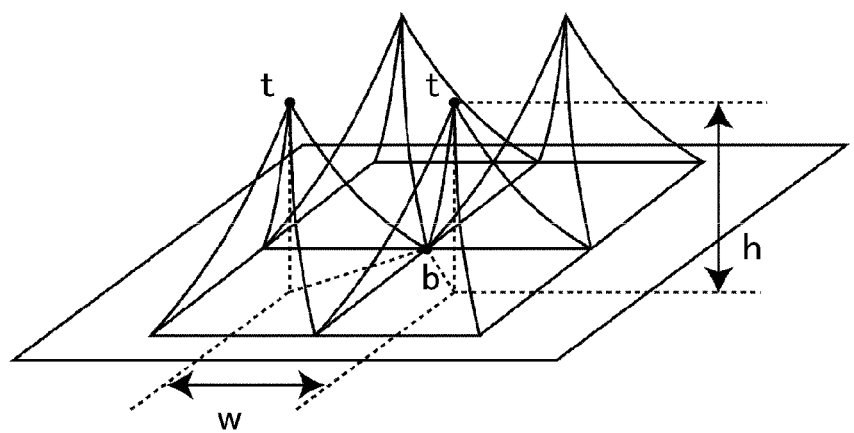
FIG. 41 is an enlarged perspective view illustrating a surface of a moth eye film in a display device of Embodiment 4 and shows the case where the unit structure of protrusions is a thorn in which a slope from the top to the bottom is steep.

The shape of a single protrusion on the moth eye film 62C is described. FIGS. 38 to 41 are enlarged perspective views each illustrating a surface of a moth eye film in a display device of Embodiment 4. FIG. 38 shows the case where the unit structure of protrusions is a cone. FIG. 39 shows the case where the unit structure of protrusions is a quadrangular pyramid. FIG. 40 shows the case where the unit structure of protrusions is a dome (bell) in which a slope from the top to the bottom is rounded. FIG. 41 shows the case where the unit structure of protrusions is a thorn in which a slope from the top to the bottom is steep. As illustrated in FIGS. 38 to 41, in the moth eye structure, the top portion of each protrusion is a top "t" and the contacting part between the adjacent protrusions is a bottom "b". As illustrated in FIGS. 38 to 41, the width "w" between the tops of the adjacent protrusions constituting the moth eye structure is indicated by a distance between two coplanar points respectively on vertical lines drawn from the tops "t" of the adjacent protrusions to the same plane. The height "h" from the bottom to the top of the moth eye structure is indicated by a distance of a vertical line drawn from the top "t" of the protrusion to a plane where the bottom "b" thereof is present. Namely, the aspect ratio per protrusion is indicated by "h/w" (the height divided by the pitch (distance between the tops)).

In the moth eye film 62c, the width "w" of the tops of the adjacent protrusions is not more than 380 nm, preferably not more than 300 nm, and still more preferably not more than 200 nm. The height "h" is 100 to 600 nm, and preferably 200 to 400 nm. In FIGS. 38 to 41, exemplified unit structures of the protrusions are cone, quadrangular pyramid, dome (bell) and thorn. However, the unit structure of the moth eye structure in Embodiment 1 is not particularly limited, provided that the top and the bottom are formed and the pitch is controlled not to exceed the visible light wavelength. For example, the slope of the protrusion may have stair-like steps.

An exemplary production method of the moth eye film 62c is described. On a 10 cm-square glass substrate, aluminum (Al) to be a material of a mold is applied by sputtering to form a film (1.0 µm thick). The aluminum is then repeatedly subjected to a treatment of anodization followed by etching. In this manner, an anodic oxide film having a large number of fine depressions is formed in which the distance between the bottoms of the adjacent depressions is not more than the visible light wavelength. Specifically, a mold of the depression is formed by a production flow comprising sequential treatments of anodization, etching, anodization, etching, anodization, etching, anodization, etching, and anodization (anodization for 5 times and etching for 4 times). Such a repetitive treatment of anodization and etching makes the shape of fine depressions to be formed have a tapering shape towards the inside of the mold.

Conditions for anodization are, for example, oxalic acid (0.6 wt %), a solution temperature of 5° C., an application voltage of 80 V, and an anodization time of 25 seconds. Adjustment of the anodization time controls the size of the depressions to be formed. Conditions for etching are, for example, phospholic acid (1 mol/l), a solution temperature of 30° C., and an etching time of 25 minutes.

On the surface of the molds different in depths of depressions produced by the above production method, a 2P (photopolymerizable) resin solution is dripped. With care to eliminate any air bubbles, a TAC film is attached to a 2P resin layer formed of the 2p resin solution with a roll. Then, the 2P resin layer is irradiated with ultra violet (UV) light at 2 J/cm$^2$ to be cured. A laminate film of the cured 2P resin film and the TAC film is peeled.

By such a method, it is possible to produce, for example, a mold in which depressions have a depth of 387 nm and a pitch of 180 nm between them, and a moth eye film 62C in which protrusions have a height of 219 nm, an aspect ratio of 1.22, and a pitch of 180 nm between them. Here, the profile of the shape and the size can be determined by a SEM (Scanning Electron Microscope).

Figure 42:
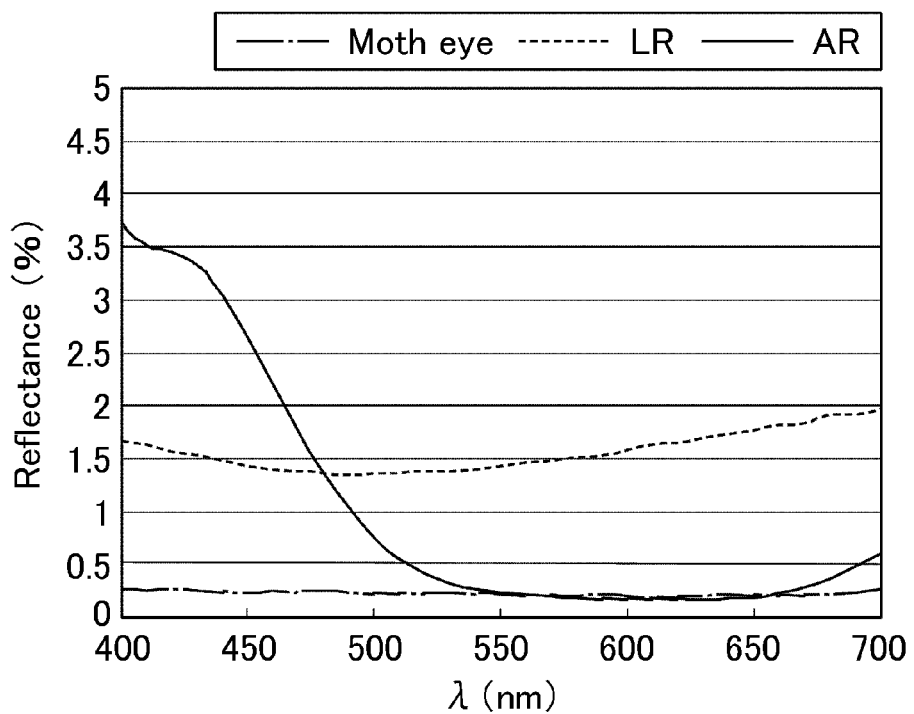
FIG. 42 is a graph showing comparison of reflection spectrums of an AR film, a LR film, and a moth eye film.
Figure 43:
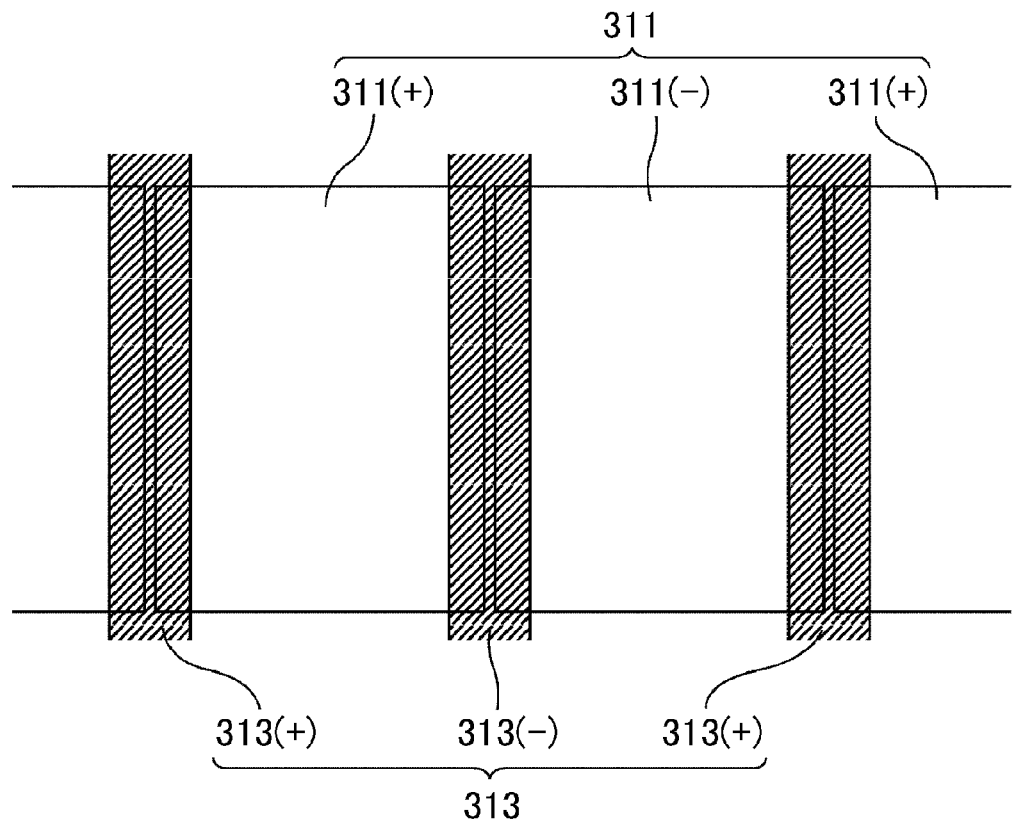
FIG. 43 is a schematic plan view illustrating an area where a coupling capacitance is formed between the pixel electrode and the source wiring and shows a case where the source wiring and the pixel electrode are not dislocated.
Figure 44:
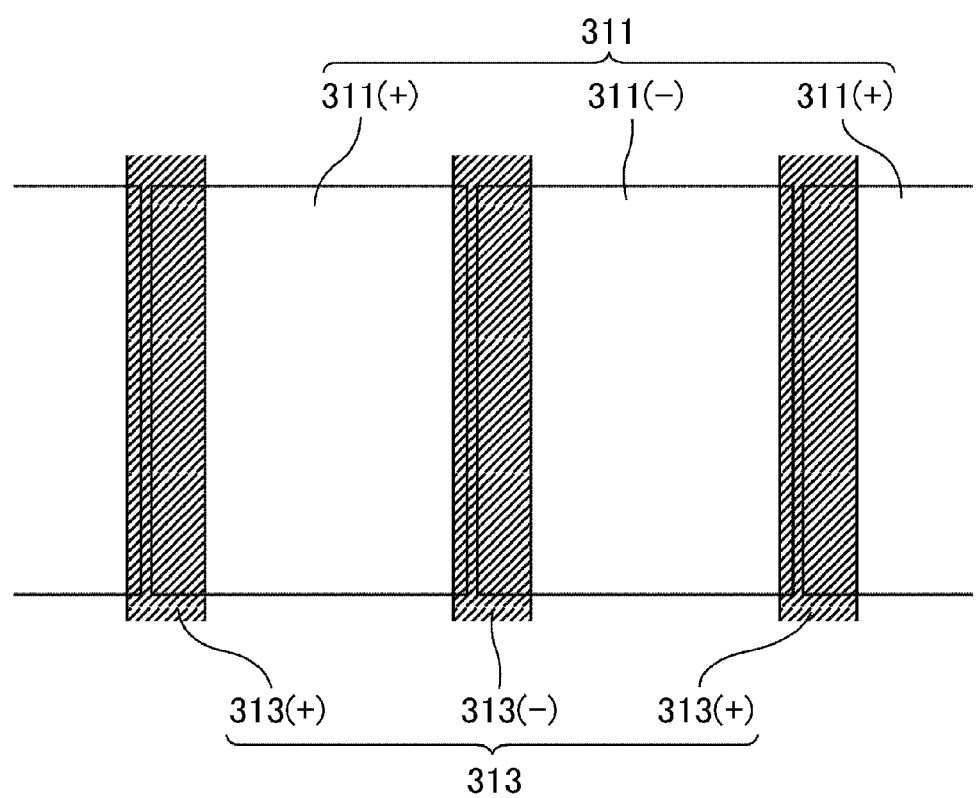
FIG. 44 is a schematic plan view illustrating a region where a coupling capacitance is formed between the pixel electrode and the source wiring and shows a case where the source wiring and the pixel electrode are dislocated.

FIG. 42 is a graph showing comparison of reflection spectrums of an AR film, a LR film, and a moth eye film. As illustrated in FIG. 42, the moth eye film is especially preferable because the reflectance of not more than 0.5% is sufficiently obtained.

The afore-mentioned Embodiments 1 to 4 may be partially or entirely employed in appropriate combination as long as the features of the active matrix substrate or the display device of the present invention are included.

The present application claims priority to Patent Application No. 2009-278781 filed in Japan on Dec. 8, 2009 under the Paris Convention and provisions of national law in a designated State, the entire contents of which are hereby incorporated by reference.

REFERENCE SIGNS LIST 11, 111, 311: Pixel electrode
12, 112: Gate wiring
13, 113, 313: Source wiring
13a: ITO layer
13b: Ti layer
13c: Al layer
13A: Main line portion 13B: Coupling portion
15, 115: Drain wiring
16, 116: Contact hole
17, 117: CS wiring
18: Semiconductor layer
19, 119: TFT
21: Black matrix
31: n⁺Si layer
32: Resist
33: Acrylic resist
34: ITO layer
41: Mask
41a: Light-shielding portion
41b: Half-tone portion
41c: Translucent portion
51: Gate insulating film
52: Passivation film
53: Interlayer insulating film
61: Liquid crystal display panel
62: Protection board
62a: Base
62b: Light interference film
62c: Moth eye film
63: Air layer

The invention claimed is:

1. An active matrix substrate comprising:
an insulating substrate;
a plurality of pixel electrodes arranged in a matrix on the insulating substrate;
a gate wiring extending in a row direction; and
a source wiring extending in a column direction so as to overlap with two pixel electrodes adjacent to each other in the row direction on the insulating substrate, wherein
the pixel electrodes and the source wiring are formed in different layers via an insulating film,
the source wiring crosses the gate wiring,
the source wiring has a main line portion extending in the column direction and extension portions extended from both sides of the main line portion in the row direction, the extension portions being arranged along the main line portion that extends in the column direction such that a first one of the extension portions overlaps a first one of the two adjacent pixel electrodes and a second one of the extension portions overlaps a second one of the two adjacent pixel electrodes, and the main line portion including at least one layer formed of a different material from layers of the extension portions such that the at least one layer of the main line portion is formed of a light shielding material and the layers of the extension portions are formed of a transparent conductive material,
the source wiring has a first region and a second region adjacent to the first region in the column direction,
the first region includes the main line portion of the source wiring extending in the column direction and at least one of the extension portions of the source wiring extending in the row direction and the second region consists of the main line portion of the source wiring extending in the column direction,
a wiring width of the first region of the source wiring is greater than a wiring width of the second region of the source wiring, and
the extension portion is formed of a transparent conductive material.

2. The active matrix substrate according to claim 1, wherein
potentials of the two pixel electrodes adjacent to each other in a row direction are different in polarity.

3. The active matrix substrate according to claim 1, wherein
the main line portion is a laminate including a layer formed of the transparent conductive material and a layer formed of a conductive material having a specific resistance lower than a specific resistance of the transparent conductive material.

4. The active matrix substrate according to claim 3, wherein
the layer formed of the transparent conductive material is formed on a side closer to the insulating substrate from the layer formed of a transparent conductive material having a specific resistance lower than the specific resistance of the transparent conductive material.

5. The active matrix substrate according to claim 1, wherein
the source wiring and the pixel electrodes are connected to each other via a thin film transistor and a drain wiring drawn from the thin film transistor, and
the drain wiring is formed of a transparent conductive material.

6. A display device comprising:
an active matrix substrate according to claim 1.

7. The display device according to claim 6, wherein
the display device has an antireflection film on a top surface of a member forming a display face.

8. The display device according to claim 6, wherein
the display device has a front board and an antireflection film attached to one or both faces of the front board.

9. The display device according to claim 7, wherein
the face with the antireflection film has a reflectance of not more than 0.5% in a visible light range.

10. The display device according to claim 7, wherein
the antireflection film is a film reducing a reflected light by light interference.

11. The display device according to claim 7, wherein
the antireflection film is a film having a plurality of protrusions on a surface, wherein the protrusions adjacent to each other have a width between tops of not more than the visible light wavelength.

* * * * *